United States Patent [19]

Kosonocky et al.

[11] Patent Number: 4,656,518

[45] Date of Patent: Apr. 7, 1987

[54] FIELD-TRANSFER CCD IMAGERS WITH POLY-PHASE IMAGE REGISTERS, OPERATED TO PROVIDE PSEUDO LINE INTERLACE ON ALTERNATE FIELDS

[75] Inventors: Walter F. Kosonocky, Skillman, N.J.; Donald F. Battson, Landisville, Pa.; Peter A. Levine, Trenton, N.J.

[73] Assignee: RCA Corporation, Princeton, N.J.

[21] Appl. No.: 807,664

[22] Filed: Dec. 11, 1985

[51] Int. Cl.$^4$ .............................................. H04N 3/14
[52] U.S. Cl. .................................................... 358/213
[58] Field of Search ............................. 358/213, 212; 357/24 LR

[56] References Cited

U.S. PATENT DOCUMENTS

| | | | |
|---|---|---|---|
| 3,801,884 | 4/1974 | Sequin | 317/235 |
| 3,932,775 | 1/1976 | Kosonocky | 307/311 |
| 4,200,934 | 4/1980 | Hofmann | 364/571 |
| 4,507,684 | 3/1986 | Battson | 358/213 |
| 4,551,762 | 11/1985 | Levine | 358/213 |
| 4,562,473 | 12/1985 | Levine | 358/213 |
| 4,574,313 | 3/1986 | Battson | 357/24 LR |
| 4,580,169 | 4/1986 | Savoye | 358/213 |
| 4,580,170 | 4/1986 | Levine | 358/213 |

Primary Examiner—Gene Z. Rubison
Assistant Examiner—Stephen Brinich
Attorney, Agent, or Firm—Eugene M. Whitacre; Peter M. Emanual; James B. Hayes

[57] ABSTRACT

The parallelly arranged charge transfer channels in the image register of a field transfer type CCD imager are clocked with a number of phases equal to 2m, m being a positive integer equal to two or more, during image transfer. The successive gate electrodes receiving each cycle of successive-in-time clock phases during image transfer are considered to be consecutively ordinally numbered first through $2m^{th}$. During the image integration times of odd fields, the first gate electrode in each cycle of the image register is biased to induce a potential energy barrier thereunder, and photoresponse charge is collected under the gate electrodes of the image register exclusive of each first gate electrode. During the integration times of even fields, the $(m+1)^{th}$ gate electrode in each gate-electrode cycle of the image register is biased to induce a potential energy barrier thereunder, and photoresponse charge is collected under the gate electrodes of the image register exclusive of each $(m+1)^{th}$ gate electrode. This provides pseudo line interlace in accordance with the invention, while minimizing the length of the potential barrier to avoid fixed-pattern partitioning noise or "grain".

11 Claims, 21 Drawing Figures

FIELD-TRANSFER CCD IMAGERS WITH POLY-PHASE IMAGE REGISTERS, OPERATED TO PROVIDE PSEUDO LINE INTERLACE ON ALTERNATE FIELDS

The present invention relates to providing for pseudo line interlace between alternate fields in a field-transfer type of CCD imager having an image register clocked in an even number of phases, at least four.

BACKGROUND OF THE INVENTION

In pseudo line interlace, charge packets descriptive of picture elements (pixels) of an optical image are formed by integrating the charge carriers generated by photoconversion over only one field time. The charge packets are descriptive of pixels centered on odd scan line loci in any odd-numbered one of consecutively number field scans and are descriptive of pixels centered on even scan line loci in any even-numbered field. In any field each pixel has a dimension in the direction perpendicular to line scan (i.e. what is normally termed the "vertical" direction) equal to that of two television scan lines.

In true line interlace, on the other hand, charge packets are descriptive of pixels with a dimension in the direction perpendicular to line scan which dimension is equal to that of a single television scan line; and these charge packets are integrated over two fields (or one frame). Over a frame time, pseudo line interlace provides single-scan-line resolution for non-moving portions of the scanned image. The effective optical aperture is wider in the direction perpendicular to line scan when using pseudo line interlace than when using true line interlace. Accordingly, pseudo line interlace has a lower modulation transfer function (MTF) than true line interlace, but spatial aliasing in the direction perpendicular to line scan is somewhat better with pseudo line interlace.

C. H. Sequin in U.S. Pat. No. 3,801,884 issued Apr. 2, 1974 and entitled "CHARGE TRANSFER IMAGER DEVICES" describes a way of providing pseudo line interlace in a field-transfer type of imager wherein the gate electrodes in the image register are successively arranged in cycles having an even number of phases, greater than three. Sequin arranges image register pitch—that is, the extent of each cycle of gate electrodes receiving differently phased clocked voltages—to extend across a space corresponding to two adjacent lines of picture elements, or "pixels". During the integration time of odd fields, contiguous gate electrodes in a first half of the gate-electrode cycle are biased to induce potential barriers under them in each image register charge transfer channel, and the charge generated by photoconversion is collected under the contiguous gate electrodes in a second half of the gate-electrode cycle. During the integration time in even fields, the gate electrodes in the second half of the gate-electrode cycle are biased to induce potential barriers under them, and the charge is collected under gate electrodes in the first half of the gate-electrode cycle.

D. F. Battson in U.S. Pat. No. 4,507,684 issued Mar. 26, 1985 and entitled "REDUCING GRAIN IN MULTI-PHASE-CLOCKED CCD IMAGERS" teaches that "grain", a fixed pattern noise which is not attributable just to dark current variations and which persists even in relatively bright images, is caused by a form of partitioning noise attributable to the induced potential barrier exceeding a prescribed length (e.g., a few microns in the processing steps RCA Corporation uses to make CCD imagers). In clocking with at least four phases in the image register, the limitations of present-day photolithographic processes, which restrict minimum gate electrode length to a few microns, make the Sequin approach to pseudo line interlace an unfavorable one to take.

W. F. Kosonocky in U.S. Pat. No. 3,932,775 issued Jan. 13, 1976 and entitled "INTERLACED READ-OUT OF CHARGE STORED IN A CHARGE COUPLED IMAGE SENSING ARRAY" describes another way of providing pseudo line interlace between alternate fields in a field-transfer type of imager, when an image register with an even number of clock phases is used. During image integration times, potential energy barriers are erected under gate electrodes spaced half a gate electrode cycle apart. Dynamic clocking is resumed after image integration in different temporal phasings on alternate fields, when a two-phase-clocked image register is used. This combines pairs of successive charge packets of single-line-resolution photoresponse into charge packets of half-as-fine-resolution photoresponse, combining them in staggered spatial phasings in alternate fields thus to provide for pseudo line interlace.

An advantage of the Kosonocky scheme of providing pseudo line interlace is that the image register gate electrodes are biased the same way during image integration in each field. This avoids field rate flicker as may otherwise be caused by gate electrode length variations in charge-integrating well size from field to field. These variations may arise because gate electrodes have non-constant lengths or because the electromotive force potentials applied to the gate electrodes exhibit undesired variation between successive fields.

Apparatus is known in which errors in the CCD imager image samples that are of known characteristics can be compensated against, using offsets taken from a programmable read-only memory (PROM). Such apparatus, it is here pointed out, can be adapted to eliminate field rate flicker problems in imagers operated other than in accordance with the Kosonocky scheme of providing pseudo line interlace. Field rate flicker in the Sequin scheme of providing pseudo line interlace could be suppressed in this way, for example. Arrangements of this general type specifically for interline transfer CCD imagers are described by Hoffman in U.S. Pat. No. 4,200,934 issued Apr. 29, 1980 and entitled "CIRCUIT ARRANGEMENT FOR CORRECTING DIGITAL SIGNALS". Arrangements of this general type specifically for CCD imagers integrating image directly in the CCD charge transfer channels are described by P.A. Levine in U.S. patent application Ser. No. 779,861 filed Sept. 25, 1985, entitled "TEMPERATURE TRACKING DEFECT CORRECTOR FOR A SOLID STATE IMAGER", and assigned to RCA Corporation.

H. Elabd, W.F. Kosonocky, and D.F. Battson in U.S. patent application Ser. No. 685,725, filed Dec. 24, 1984, entitled "CCD IMAGERS WITH PIXELS AT LEAST THIRTY MICRONS LONG IN THE DIRECTION OF CHARGE TRANSFER", and assigned to RCA Corporation point out the desirability of clocking the image register of a CCD imagers in a large number of phases when pixel dimensions are long in the direction of charge transfer. This is done to avoid having to have overlong gate electrodes in the image register and thus keep grain acceptably low.

Kosonocky points out in U.S. Pat. No. 3,932,775 that his scheme of providing pseudo line interlace can also be carried out with an even number of clock phases larger than, two—e.g. four phases. However, this requires a special set of clocking signal voltages to be applied to the image register gate electrodes when changing from image integration to field transfer modes of operation. These special clocking signal voltages are needed to provide a proper transition between the gate electrode voltage condition during image integration and the gate electrode voltage clocking sequence during image transfer from the image register to the field storage register. That is, one cannot simply halt the dynamic clocking used during image transfer, perform image integration, then resume dynamic clocking during the next image transfer, as is done in two-phase clocking.

A shortcoming of the Sequin interlace scheme is that more than one gate electrode in the image register pitch is biased to induce a potential barrier thereunder during image integration. This can compromise imager low noise performance by raising dark current and its attendant shot noise slightly. During image integration it is common practice to reduce the depth of potential energy wells to lessen the amount of dark current integrated in them. Dark current generation increases at faster than linear rate with increase in well depth, so a short and deep well tends to accumulate more dark current charge than a long and shallow well of similar charge-containing capacity. While average dark current can be predicted and compensated against, the thermal noise associated with variations in dark current level, cannot be predicted and then compensated for. This effect would be noted in the Kosonocky imager also except for the fact that the $\phi_{2\text{-}A}$, $\phi_{4\text{-}A}$ gate electrodes are usually made considerably shorter length than the $\phi_{1\text{-}A}$, $\phi_{3\text{-}A}$ gate electrodes.

During image integration in a CCD imager, the image register of which is provided with anti-blooming drains, there can be some loss to the drains of photoresponse originating in those portions of the image register charge transfer channels in which potential barriers are induced. If only one gate electrode in the image register pitch is biased to induce a potential barrier thereunder, this loss is reduced, the present inventors point out. Not only does this improve overall photoefficiency by a small amount, it reduces a line-rate alias term in the imager response.

SUMMARY OF THE INVENTION

The parallelly arrayed charge transfer channels in the image register of a CCD imager are clocked with an even number of phases, 2m equal to four or more, during image transfer. (That is the number of image register clocking phase is twice m, m being a positive imager at least two.) The successive gate electrodes receiving each cycle of successive-in-time clock phases during image transfer are considered to be consecutively ordinally numbered first through $2m^{th}$. During the image integration times of odd fields, the first gate electrode in each cycle of the image register is biased to induce a potential energy barrier thereunder, and photoresponse charge is collected under the gate electrodes of the image register exclusive of each first gate electrode. During the integration times of even fields, the $(m+1)^{th}$ gate electrode in each gate-electrode cycle of the image register is biased to induce a potential energy barrier thereunder, and photoresponse charge is collected under the gate electrodes of the image register exclusive of each $(m+1)^{th}$ gate electrode. This provides pseudo line interlace in accordance with the invention, while minimizing the length of the potential barrier to avoid partitioning noise or "grain".

BRIEF DESSCRIPTION OF THE DRAWING

FIGURE 1 is a diagram of potential energy levels in the image register of a CCD imager operated in accordance with U.S. Pat. No. 3,932,775.

FIG. 2 is a diagram of potential energy levels in the image register of a CCD imager operated in accordance with U.S. Pat. No. 3,801,884.

Figure 11:
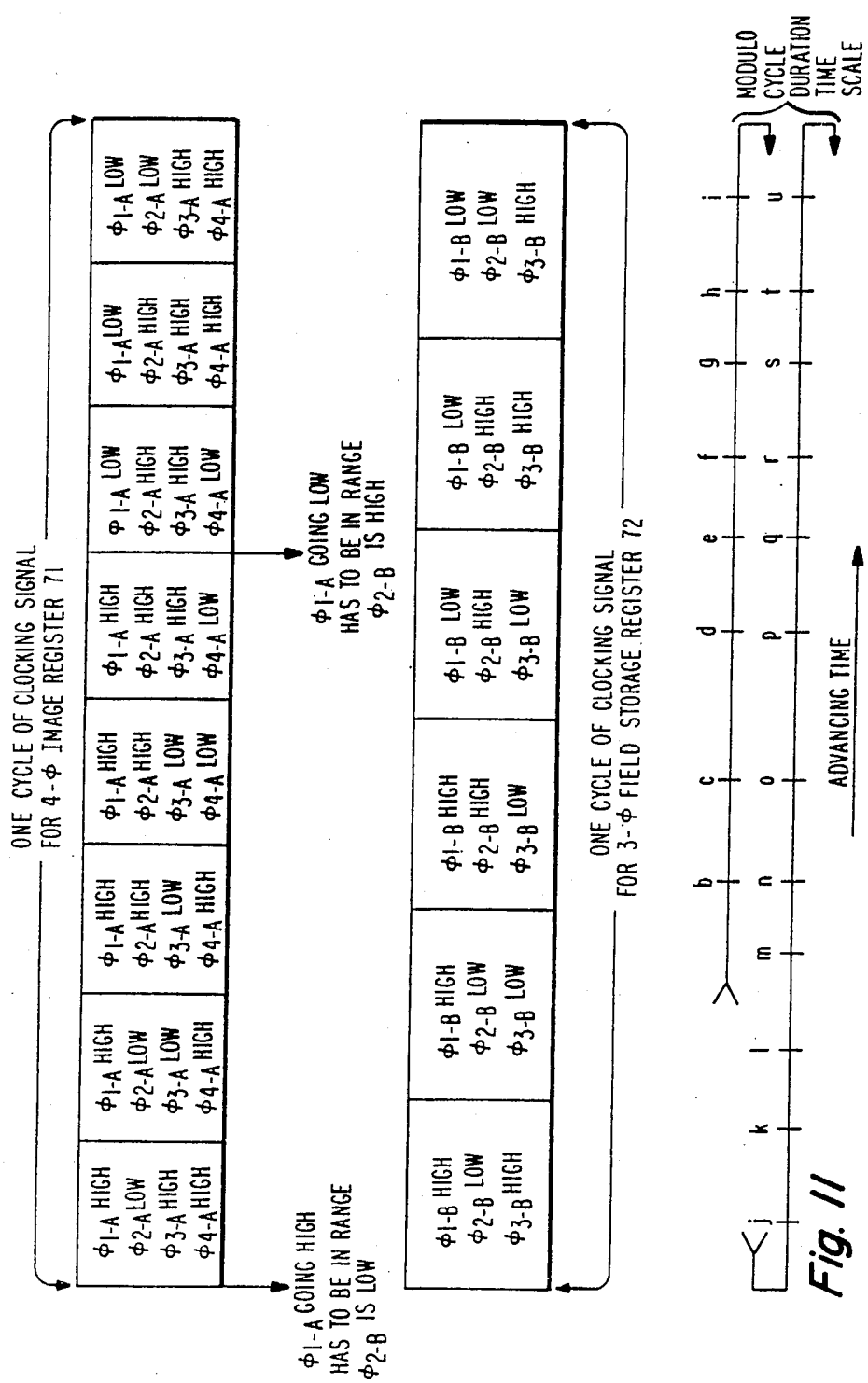

FIG. 11 is a timing diagram showing the range of respective clocking signal phases permissible when forward clocking a four-phase image register followed in cascade connection by a three-phase field storage register, as done in certain embodiments of the invention. Within this range, one avoids destroying the information contained in charge packets transferred from the four-phase image register to the three-phase field storage register.

Figure 12A:
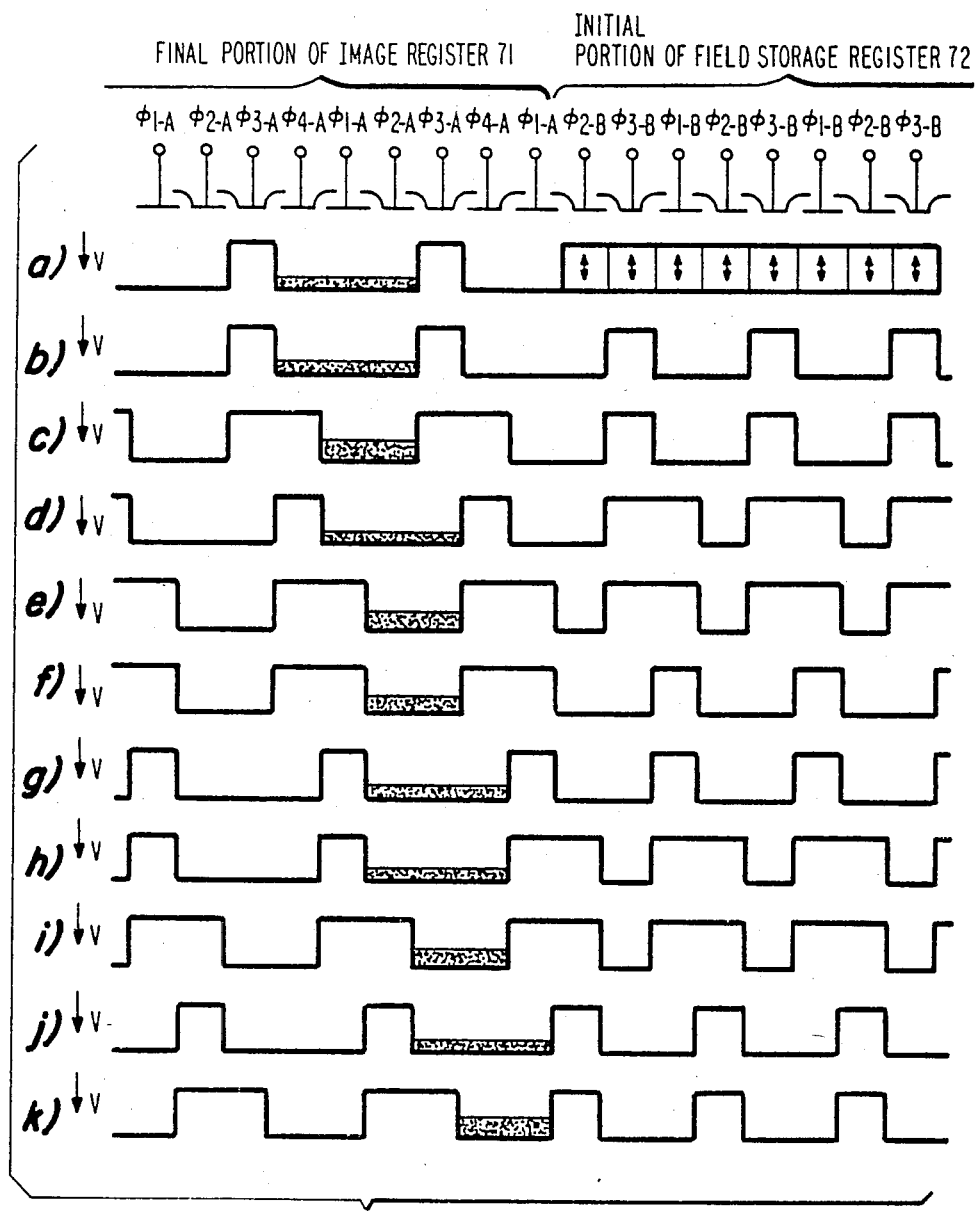

FIG. 12A and 12B are a succession of in-channel potential profiles illustrative of a preferred one of the forward clocking processes indicated in FIG. 11 to be permissible.

Figure 13:
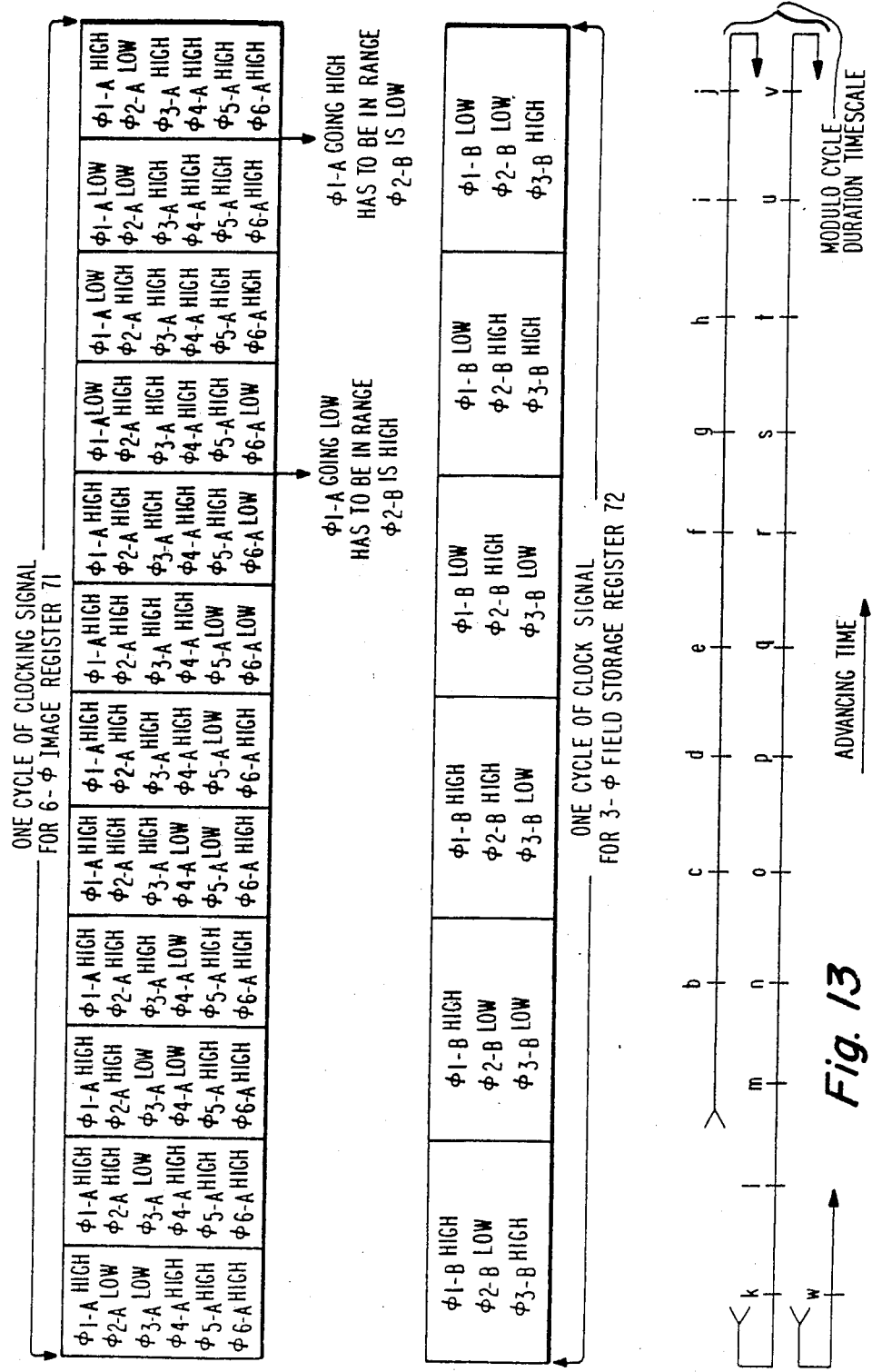

FIG. 13 is a timing diagram showing the range of respective clocking signal phases permissible when forward clocking a six-phase image register followed in cascade connection by a three-phase field storage register, as done in certain embodiments of the invention. Within this range, one avoids destroying the information contained in charge packets transferred from the six-phase image register to the three-phase field storage register.

Figure 14A:
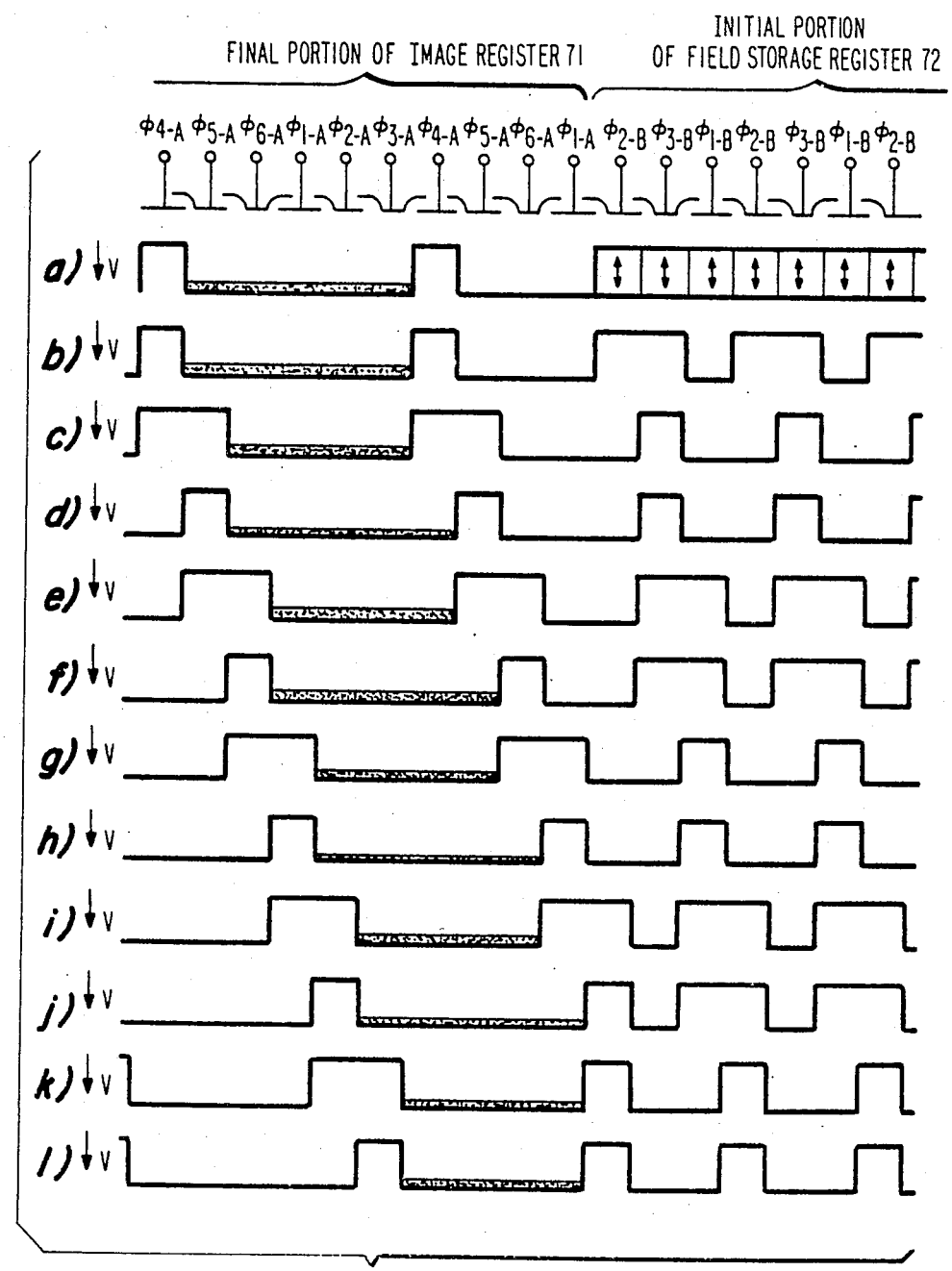
Figure 14B:
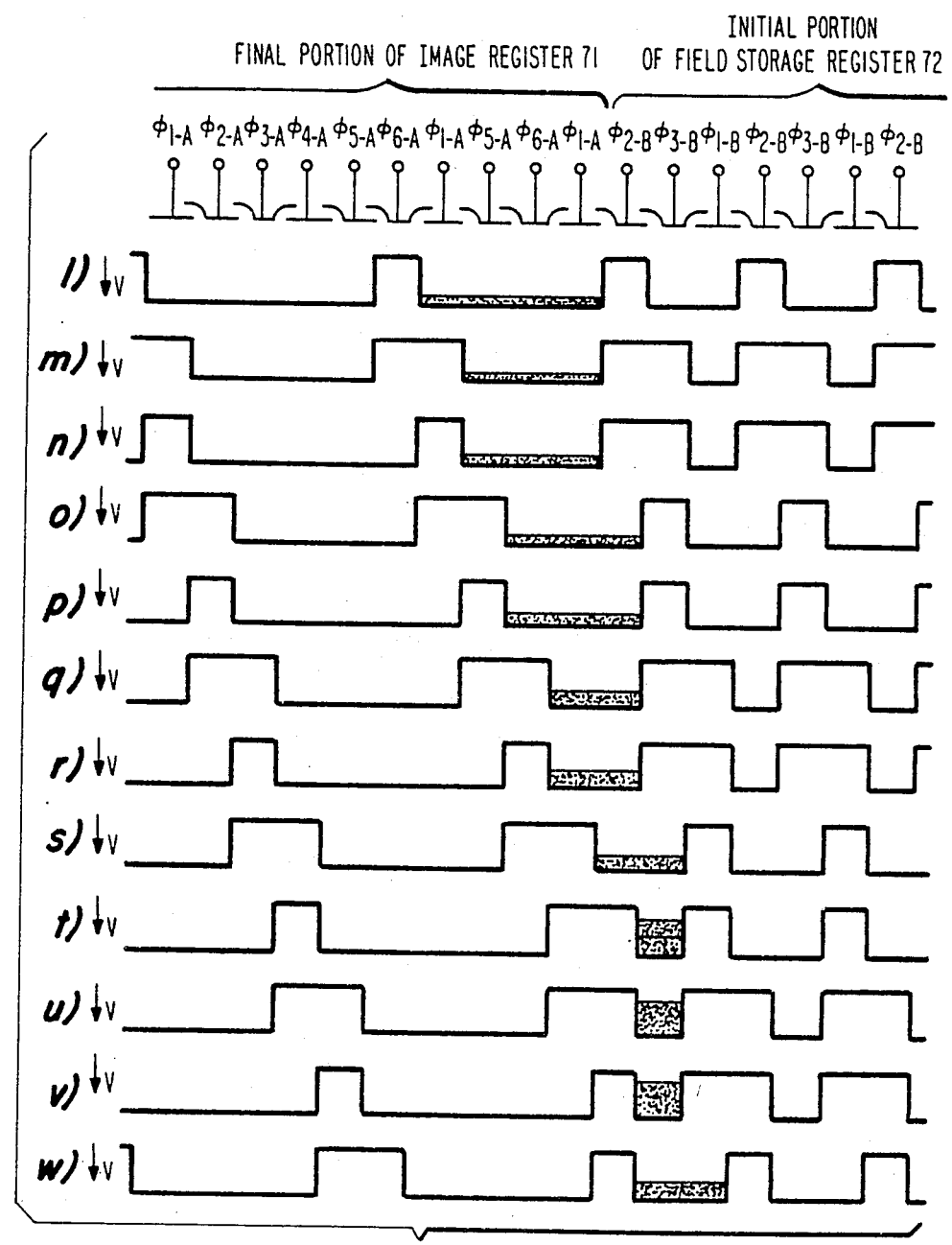

FIGURES 14A and 14B are a succession of in-channel potential profiles illustrative of a preferred one of the forward clocking processes indicated in FIG. 13 to be permissible.

Figure 15:
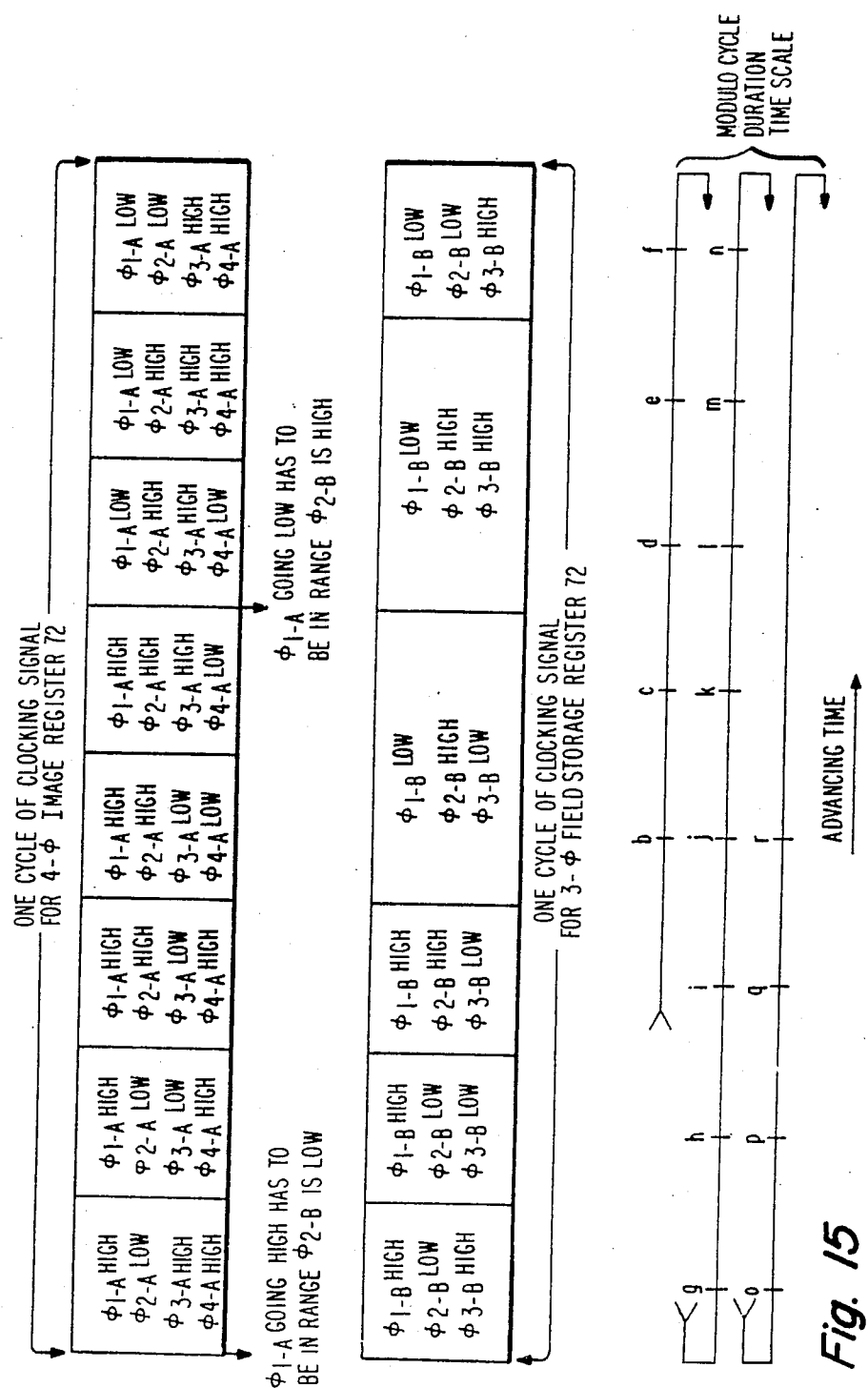

FIG. 15 is a timing diagram showing a way alternative to that of FIG. 11 for forward clocking a four-phase image register followed in cascade by a three-phase field storage register, as done in certain embodiments of the invention.

Figure 16:
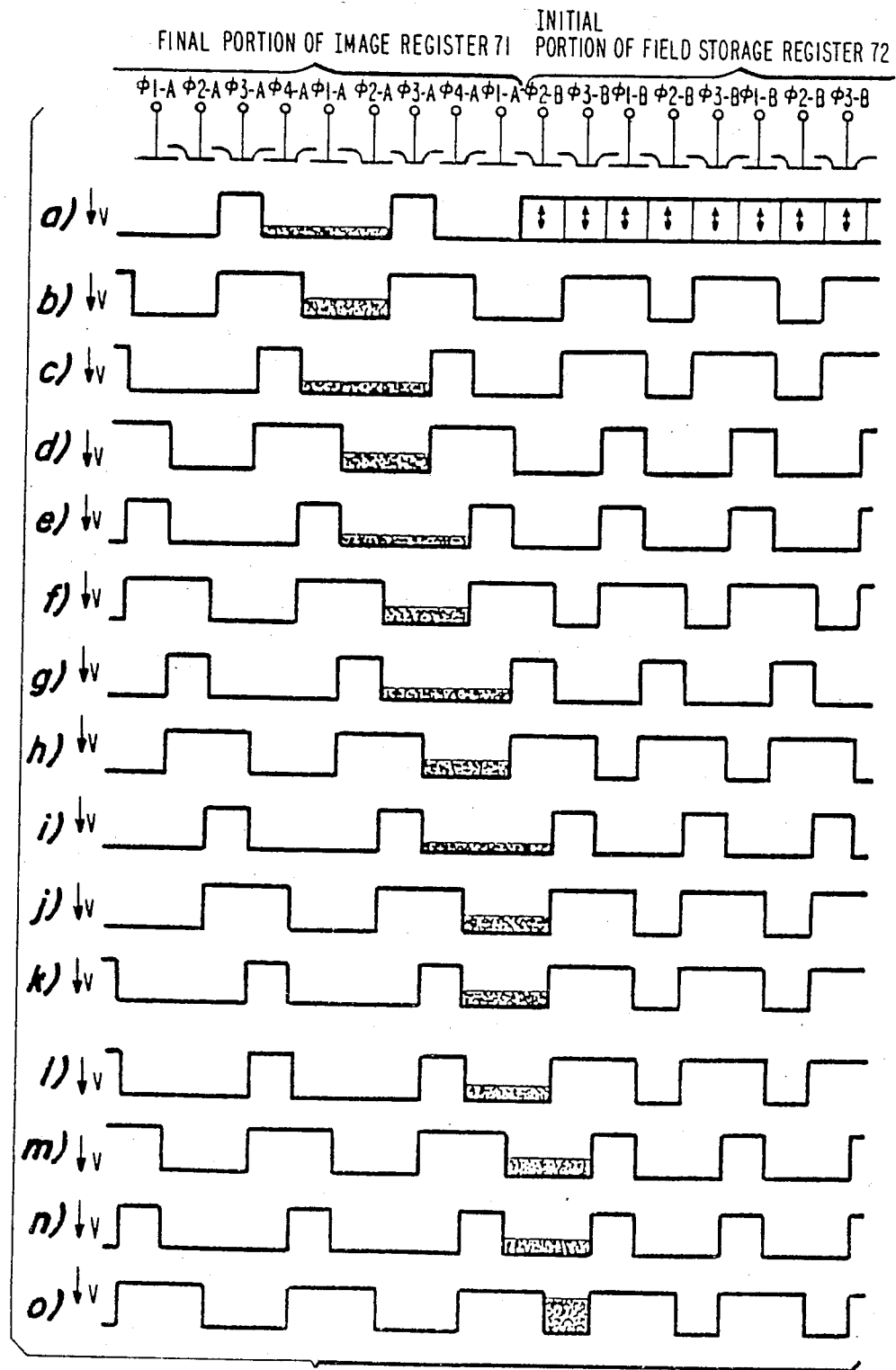

FIG. 16 is a succession of in-channel potential profiles illustrative of one of the forward clocking processes indicated in FIG. 15 to be a permissible one.

Figure 17:
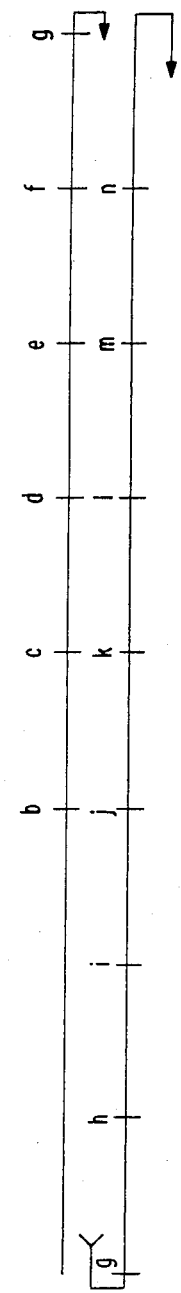

FIG. 17 is a timing diagram showing a way alternative to that of FIG. 11 for forward clocking a four-phase image register followed in cascade by a three-phase field storage register, as done in certain embodiments of the invention.

Figure 18A:
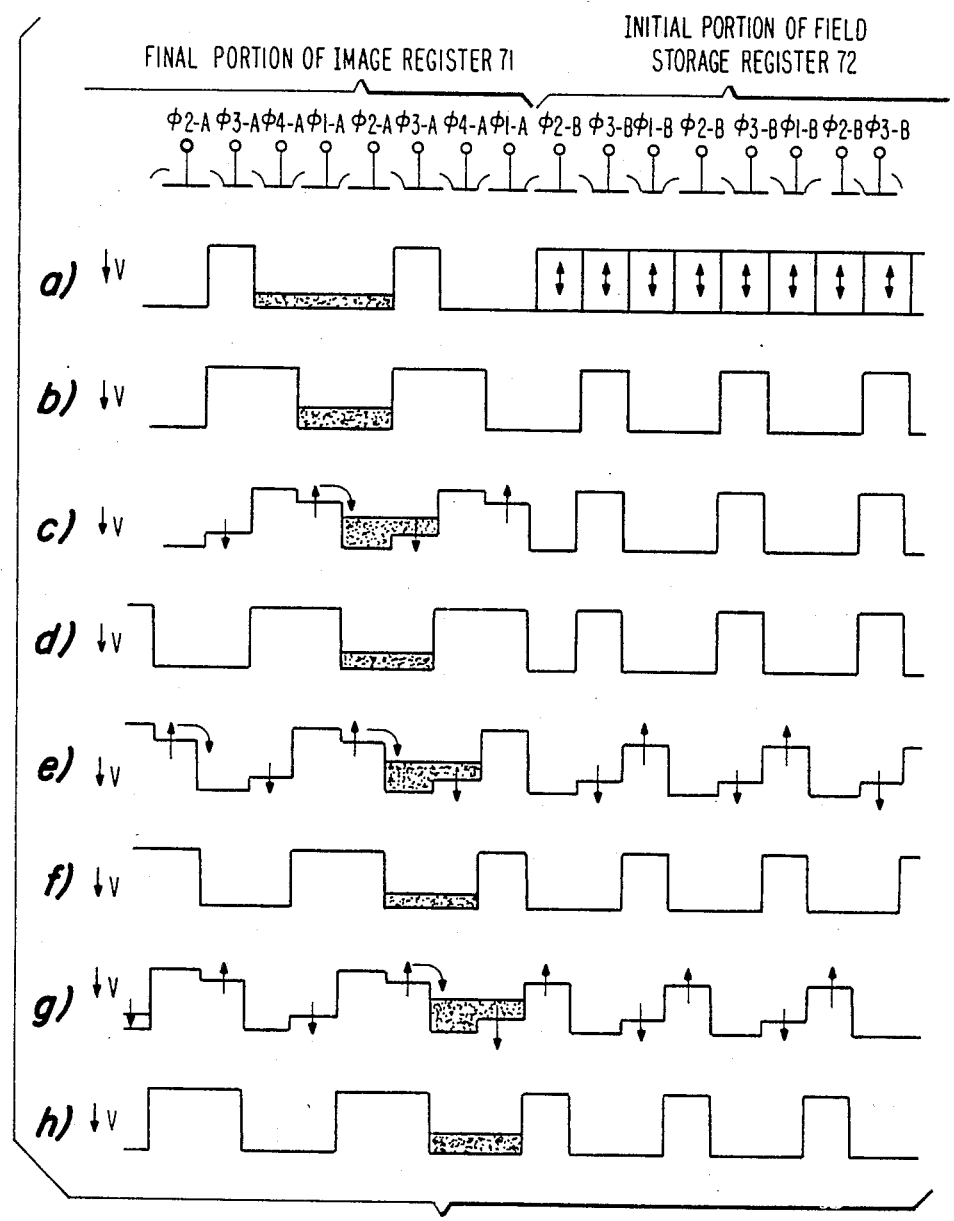
Figure 18B:
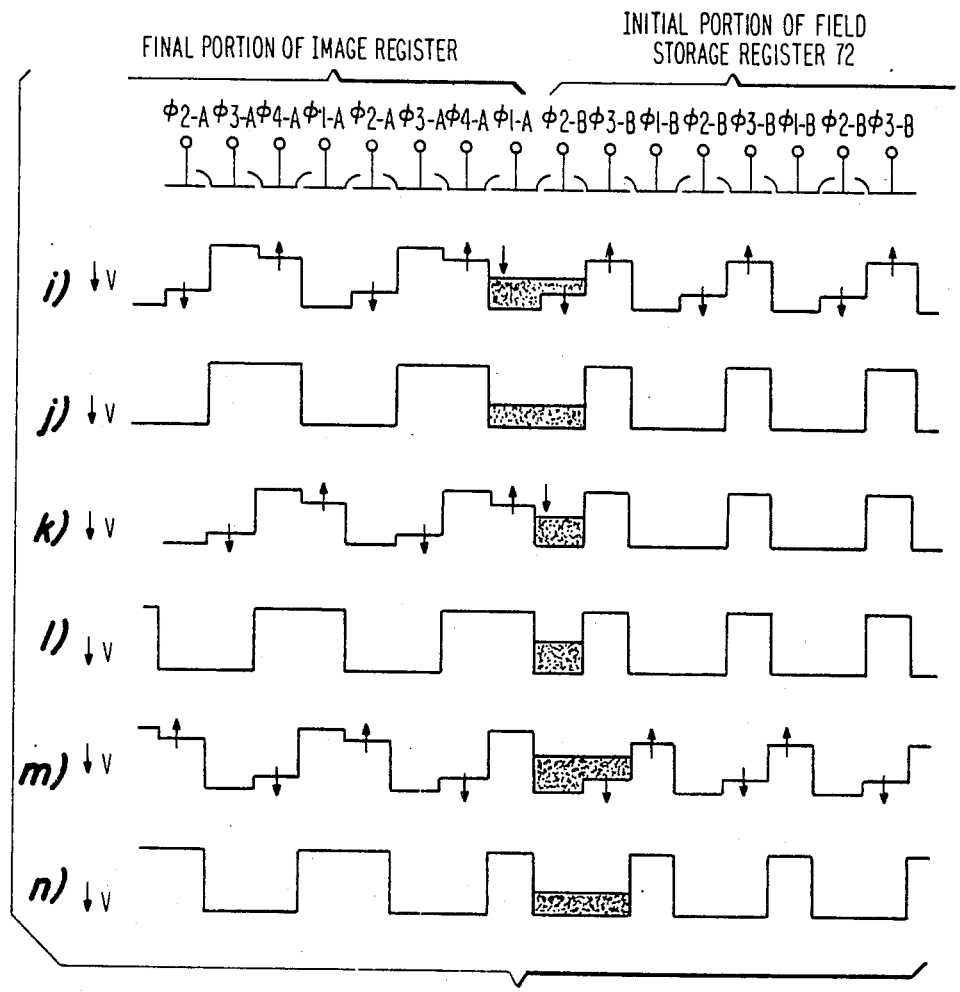

FIGS. 18A and 18B are a succession of in-channel potential profiles illustrative of one of the forward clocking processes indicated in FIG. 15 to be a permissible one.

DETAILED DESCRIPTION

Figure 1:
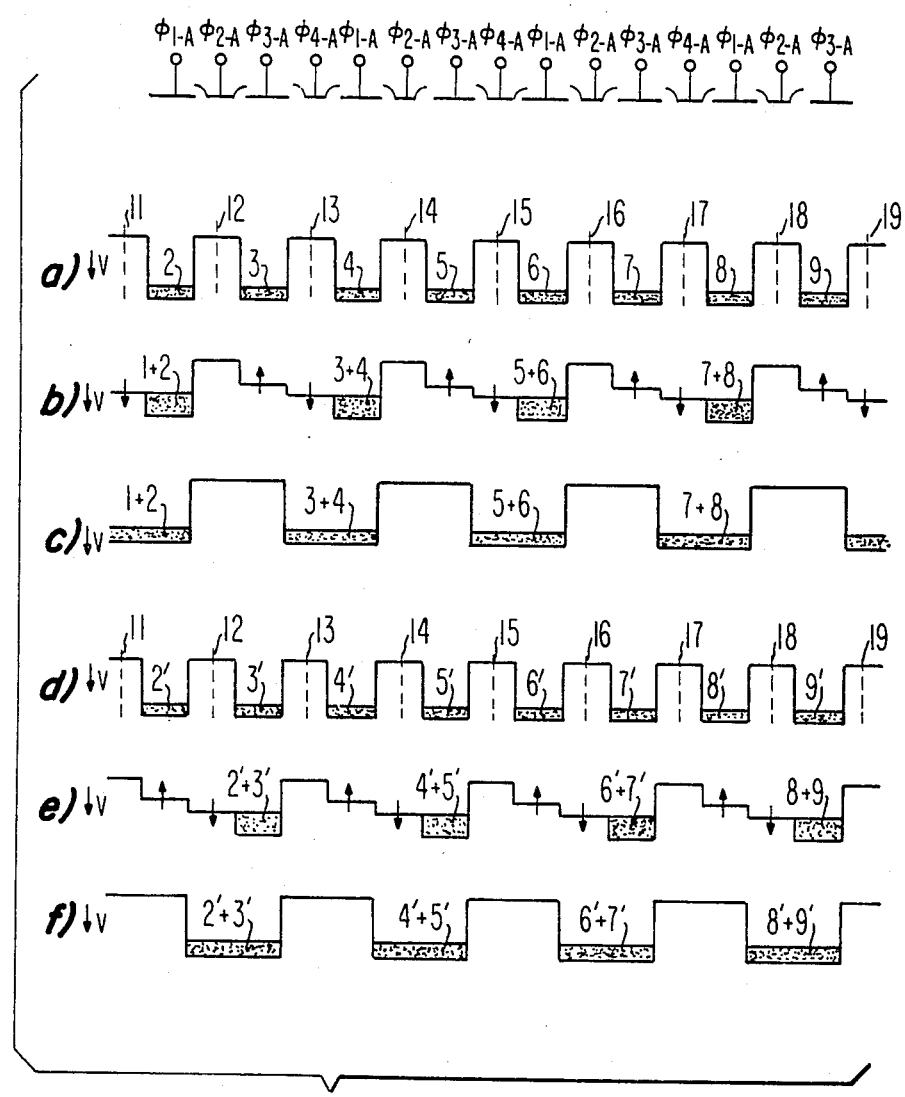

FIG. 1 is a diagram of potential energy levels in the four-phase CCD image register of the prior-art Kosonocky imager. The succession of gate electrodes in any one of the charge transfer channels of the image register is at the top of the figure, and the spatial position of potential energy levels in the charge transfer channel are with reference to these overlying gate electrodes. The gate electrodes are grouped into cycles of four successive gate electrodes to which successive-in-time clocking voltage phases $\phi_{1-A}$, $\phi_{2-A}$, $\phi_{3-A}$, $\phi_{4-A}$ are applied during field transfer intervals. During these intervals successive charge packets in each charge transfer channel of the image register are transferred to the respective one of the charge transfer channels of the field storage register which is in cascade after that image-register charge transfer channel. These clocking voltage phases $\phi_{1-A}$, $\phi_{2-A}$, $\phi_{3-A}$, $\phi_{4-A}$ are electromotive force potentials. The highest in-channel potential energy levels or "charge barriers" are induced under gate electrodes receiving the lowest electromotive force voltage and are associated with relatively low in-channel electrostatic potential V. Photoresponse charge collected into packets are drawn in stipple. The units of charge measurement are electrons, and the electrons (generated by photoconversion of light in the image register) are collected in potential energy "wells" having relatively positive electrostatic potential. These wells are electrostatically induced under gate electrodes being located closer to the semiconductor substrate, or receiving relatively positive potentials, or both.

The successive fields of samples of respective image element intensities supplied by a CCD imager of field transfer type arbitrarily will be consecutively ordinally numbered in compliance with the convention used in U.S. broadcast television standards. Line interlace between odd and even fields will presume that the first line in a frame, consisting of an odd field followed by an even field, is supplied in the odd field.

In FIG. 1 potential energy profile (a) concerns image integration in the image register during the time intervals when an even field of samples of respective image element intensities are being transferred out of the field storage register. In the image register, which receives static gate electrode voltages, samples of respective image element intensities are being accumulated from photoresponse charge. The $\phi_{2-A}$ and $\phi_{4-A}$ gate electrodes receive more negative voltage than the $\phi_{1-A}$ and $\phi_{3-A}$ gate electrodes. This establishes potential energy barriers to the flow of charge in the portions of the image-register charge transfer channels underlying the $\phi_{2-A}$ and $\phi_{4-A}$ gate electrodes, and it establishes potential energy wells in the portions of the image-register charge transfer channels underlying the $\phi_{1-A}$ and $\phi_{3-A}$ gate electrodes. These wells provide for the collection of packets 1 (not shown), 2, 3, 4, 5, 6, 7, 8, 9, etc. of photogenerated (electron) charge, which represent single-line spatial resolution in the direction of charge transfer from image register to field storage register—that is, in the "vertical" direction in a conventional television camera image. These lines of charge packets are to be combined on a successive adjacent pair basis to form the image element intensity samples for the odd field.

FIG. 1 potential energy profile (b) shows the transitional clocking that takes place prior to charge transfer for loading the field storage register with odd-field samples of image element intensity. Arrows crossing electrostatic potential levels indicate the directions those levels are changing during the depicted transition in clocking voltage levels. $\phi_{3-A}$ gate electrodes are clocked more negative to go to the same relatively negative potential as the preceding $\phi_{2-A}$ gate electrodes, while the $\phi_{4-A}$ gate electrodes are clocked more positive to go to the same relatively positive potential as the succeeding $\phi_{1-A}$ gate electrodes. The odd-numbered charge packets 1, 3, 5, 7, 9 descriptive of single-line-vertical-resolution image elements merge with the next-higher-and-even-numbered charge packets during this transitional clocking. The resulting charge packets have only two-linear vertical resolution.

FIG. 1 potential energy profile (c) shows the disposition in the image register of charge packets with two-line-vertical-resolution at the onset of four-phase forward clocking of odd-field samples to the field storage register. These charge packets will be sensed in odd-field raster-scan order after their being read out of the field storage register in the following odd field.

FIG. 1 potential energy profile (d) concerns image integration of even-field samples in the image register during the time intervals when those odd-field samples are being read from the field storage register. Samples of respective image elements of single-line-vertical-resolution are being accumulated from photoresponse charge under gate electrodes receptive of static clocking voltages, exactly as was done in the previous field, as can be discerned by comparing potential energy profiles (a) and (d).

FIG. 1 potential energy profile (e) shows the transitional clocking that takes place prior to charge transfer for loading the field storage register with even-field samples of image element intensity. The $\phi_{1-A}$ gate electrodes are clocked more negative to go to the same relatively negative potential as the preceding $\phi_{4-A}$ gate electrodes, while the $\phi_{2-A}$ gate electrodes are clocked more positive to go to the same relatively negative potential as the succeeding $\phi_{3-A}$ gate electrodes. The even-numbered charge packets 2, 4, 6, 8 descriptive of single-line-vertical-resolution image elements merge with the next higher-and-odd-numbered charge packets during this transitional clocking. The two-line-vertical-resolution image elements thus formed at a time previous to transfer of even-field samples to the field storage register are spatially interleaved with the two-line-vertical-resolution image element formed a field previously, in the transitional clocking previous to transfer of odd-field samples to the field storage register.

FIG. 1 potential energy profile (f) shows the disposition in the image register of charge packets with two-line-vertical resolution at the onset of four-phase forward clocking of even-field samples to the field storage register. These charge packets will be sensed in even-line raster-scan order after their being read from the field storage register in the following even field.

Figure 2:
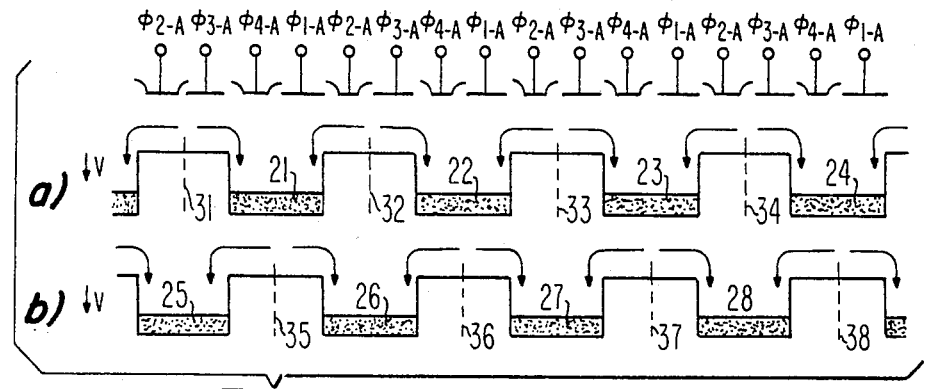

FIG. 2 is a diagram of potential energy levels and accumulated charge packet patterns in the prior-art Sequin four-phase imager, prior to charge transfer to the field imager. The FIG. 2 (a) profile is the image-register potential energy profile at the close of image integration for accumulating odd-field samples (when the read out of even-field samples from the field storage register is being completed), and the FIG. 2 (b) profile is the image-register potential energy profile at the close of image integration for accumulating even-field samples (when the read out of odd-field samples from the field storage register is being completed).

During the integration of odd-field samples, as drawn in FIG. 2 (a) profile, gate electrodes $\phi_{2-A}$ and $\phi_{3-A}$ in the image register are biased relatively negative to induce potential energy barrier in those portions of the image-register charge transfer channels underlying these gate electrodes. The $\phi_{1-A}$ and $\phi_{4-A}$ gate electrodes are biased relatively positive to induce potential energy wells thereunder for collecting photoresponse charge into charge packets descriptive of the intensity of image elements in the odd fields.

During the integration of even-field samples, as shown in FIG. 2 (b) profile, $\phi_{4-A}$ and $\phi_{1-A}$ gate electrodes are based relatively negative to induce potential energy barriers in the underlying portions of the image-register charge transfer channels. The $\phi_{2-A}$ and $\phi_{3-A}$ gate electrodes are based relatively positive to induce potential energy wells thereunder for collecting photoresponse charge into charge packets descriptive of the intensity of image elements in the even fields.

It is important to fully understand why the Kosonocky and Sequin interlace schemes provide pseudo line interlace, rather than true line interlace. It is widely appreciated by imager designers that in pseudo line interlace schemes the charge packets descriptive of each image field are integrated, not over two field times (i.e. a frame time), but only over one field time. Since all charge packets integrated during an image integration interval must be transferred out of the image register sequentially by rows during each field transfer in the field-transfer type of CCD imager, one cannot arrange for alternate rows of charge packets to be retained in the image register for another field time. Since the temporal interlacing of image element intensity samples that characterizes true line interlace is absent, the term "pseudo line interlace" (or, more recently, the term "field integration mode") is used to describe this form of operation. It is important also to understand that the spatial interlacing of image element intensity samples in the Kosonocky imager and in the Sequin imager differs from the spatial interlacing of image elements in true line interlace, as well. If one overlaps adjacent gate electrodes, as is present-day practice in imager design, the effective optical aperture in true line interlace is one television scan line in the direction of line advance in true line interlace, but is two television scan lines in pseudo line interlace. This conclusion is based on analyses conducted in accordance with D.F. Battson's teaching in U.S. Pat. No. 4,507,684, which analyses will now be described.

Photoresponse charge generated in the portions of the image-register charge transfer channel in which potential energy barriers are induced are in large portion collected in the potential energy wells closest by the points each electron making up the photoresponse charge is generated. Consider the Kosonocky imager, a portion of the image register of which appears in FIG. 1. In the potential energy profiles (a) and (b) of FIG. 1 each of the potential energy barriers, under the $\phi_{2-A}$ and $\phi_{4-A}$ gate electrodes, has a "continental divide" (as respectively indicated by dashed lines 11, 12, 13, 14, 15, 16, 17, etc.) for charge somewhere close to its center. Photoresponse charge generated to the left of a "continental divide" (11, 12, 13, 14, 15, 16, 17, 18 or 19) statistically tends to be collected in the preceding potential energy well immediately to the left of the potential energy barrier; photoresponse charge generated to the right of a "continental divide" statistically tends to be collected in the succeeding potential energy well immediately to the right of the potential energy barrier. Except for collection in the anti-blooming drains of a portion of the photoresponse charge generated in the potential-energy-barrier regions of the image-register charge transfer channel, all the photoresponse charge generated during an image integration time is collected in the potential energy wells. The "vertical" dimension of the pixel extends from one continental divide to the next, rather than being defined by the length of the potential energy well.

Consider what this means insofar as the Sequin imager, the potential energy profiles for which appear in FIG. 2, is concerned. In the integration of odd-field samples—as can be seen from FIG. 2(a) profile—charge packet 21 describes the intensity of an image element with vertical dimension bounded by continental divides 31 and 32; charge packet 22 describes the intensity of an image element with vertical dimension bounded by continental divides 32 and 33; charge packet 23 describes an image element with vertical dimension bounded by continental divides 33 and 34; charge packet 24 describes an image element with vertical dimension bounded by continental divide 34 and another continental divide to the right, off figure; etc. In the integration of even-field samples—as can be seen from FIG. 2(b) profile—charge packet 25 describes the intensity of an image element with vertical dimension bounded by a continental divide to the left, off figure, and continental divide 35; charge packet 26 describes an image element with vertical dimension bounded by continental divides 35 and 36; charge packet 27 describes an image element with vertical dimension bounded by continental divides 36 and 37; charge packet 28 describes an image element with vertical dimensions bounded by continental divides 37 and 38; etc. That is, these successive image elements are not single-line-resolution elements, separated by spaces corresponding to the potential energy barriers, as one might be led to believe from reading Sequin's U.S. Pat. No. 3,801,884. Rather, essentially, these successive image elements are contiguous and have vertical dimensions of two television scan lines. The interlace is pseudo line interlace in a spatial sense as well as temporal sense. Contiguous rows of two-line-resolution image elements occur in all fields, with rows positioned alternatively between a first spatial phasing during odd fields and a second spatial phasing during even fields. This, rather than alternate rows of single-line-resolution image elements being used in alternate fields, as would be the case if true line interlace obtained between sets of alternate fields. Partitioning noise is noise associated with the uncertainty of the division of photoresponse charge originating in a potential energy barrier region into two portions, one of which portions of charge migrates to the preceding potential energy well, and the other of which portions of charge migrates to the succeeding potential energy well. This uncertainty is less severe where the wells are close-by enough to create fringing fields of electrostatic force that provide definite field gradients to direct the paths of charge migration. If potential energy barriers are induced in lengthy portions of the charge transfer channels in the image register during image integration, these long barriers will give rise to excessive partitioning noise. This partitioning noise, which is a fixed pattern noise, is commonly referred to as "grain", because its visual appearance is similar to that of the "grain" of silver halide photography. The two-gate-electrode-long potential energy barriers of the Sequin imager are associated with excessive grain, assuming the gate electrode lengths are those used in present-day conventional photolithography.

Figure 3:
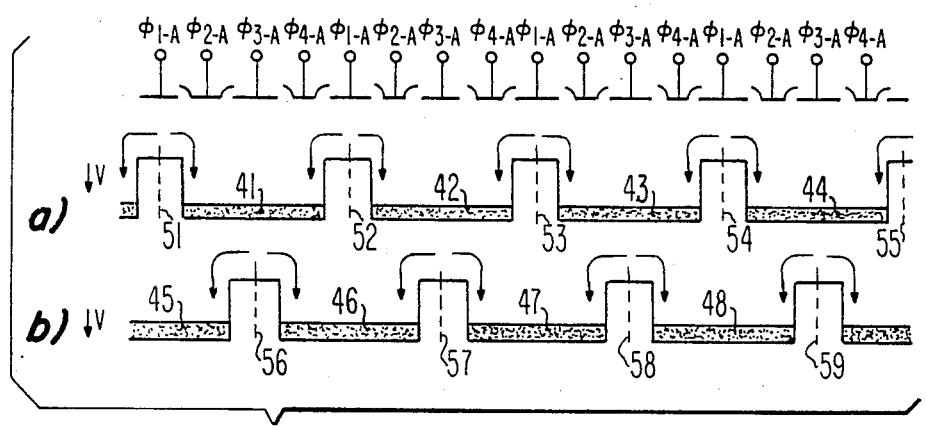
FIG. 3 is a diagram of potential energy levels in the four-phase-clocked image register of a CCD imager operated in accordance with the invention.

FIG. 3 shows the potential energy profiles (a) and (b) used in the four-phase image register of a CCD imager embodying the present invention. Integration of odd-field samples 41, 42, 43, 44, etc. is done in potential energy wells induced under respective groups of contiguous $\phi_{2-A}$, $\phi_{3-A}$, $\phi_{4-A}$ gate electrodes, with potential energy barriers being induced only under the $\phi_{1-A}$ gate electrodes, as shown in FIG. 3(a) profile. Integration of even-field samples 45, 46, 47, 48, etc. is done in potential energy wells induced under respective groups of contiguous $\phi_{4-A}$, $\phi_{1-A}$, $\phi_{2-A}$ gate electrodes, with potential energy barriers being induced only under the $\phi_{3-A}$ gate electrodes, as shown in FIG. 3(b) profile. Potential energy barriers of less than seven micron length tend to have acceptably low grain, and the length of a single gate electrode can be made this short with present-day conventional photolithography. The fringing fields during odd-field image integration define the placements of continental divides 51, 52, 53, 54, 55, etc. more accurately than the placements of continental divides 31, 32, 33, 34 etc. The fringing fields during even-field integration define the placements of continental divides 56, 57, 58, 59, etc. more accurately than the placements of continental divides 35, 36, 37, 38, etc. So partitioning noise is reduced respective to a Sequin imager.

The migration of charge from the potential energy barrier regions into the customary anti-blooming drains is reduced also, because the fringing fields of the potential energy wells in the image-register charge transfer channels accelerate charge into them, so there is less time for charge migration to the anti-blooming drains before it can be collected in the in-channel potential energy wells. This, too, reduces partitioning noise; and furthermore, it increases photoefficiency at the imager output.

Note that the vertical dimension of the image element is still equal to the length of the gate electrode cycle, or image register pitch, although potential energy barriers are narrowed. Charge packet 41 describes the intensity of an image element with vertical dimension bounded by continental divides 51 and 52. Charge packets 42-48 describe the intensities of image elements with similar length vertical dimensions.

Figure 4:
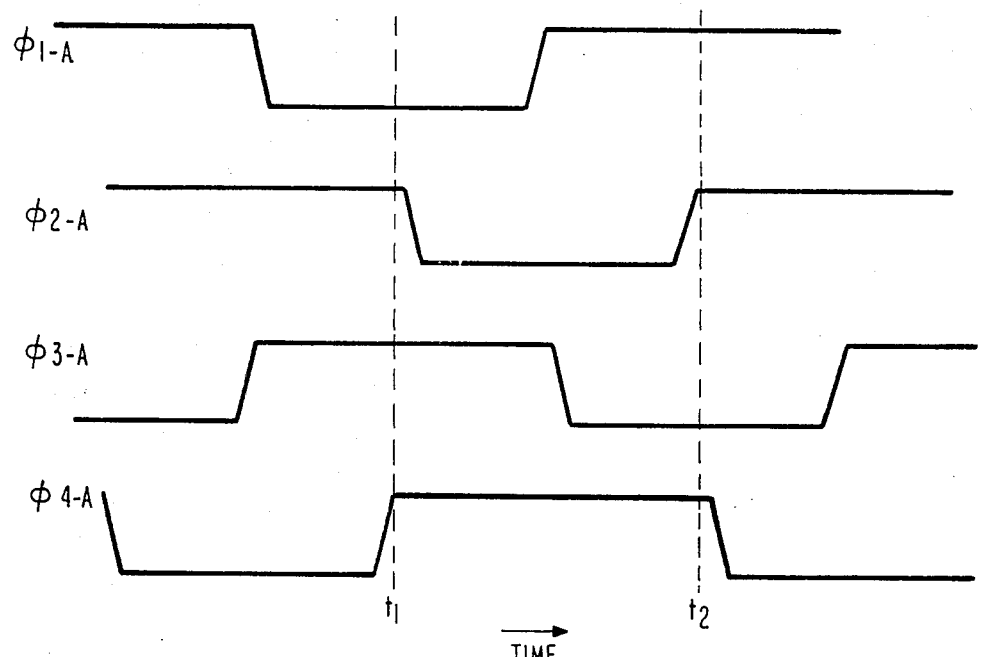
FIG. 4 is a timing diagram of four-phase image register clocking voltages used in certain CCD imagers embodying the invention.
Figure 5:
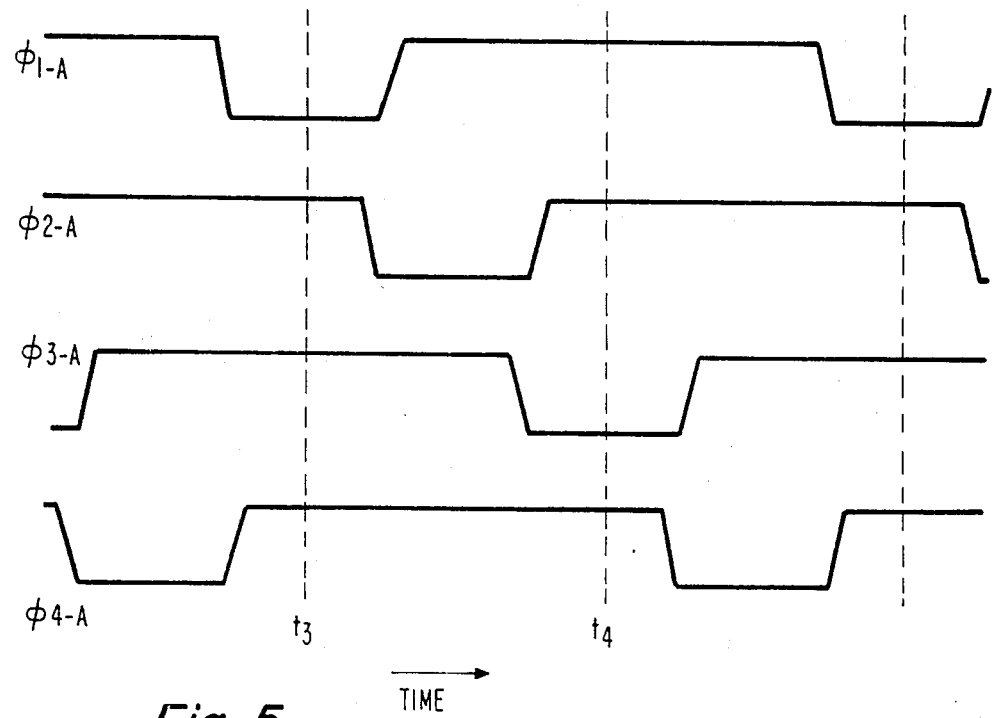
FIG. 5 is a timing diagram of four-phase image-register clocking voltages used in other CCD imagers embodying the invention.

As noted in the BACKGROUND OF THE INVENTION, it is desirable to have the application of static potentials to the $\phi_{1-A}$, $\phi_{2-A}$, $\phi_{3-A}$, $\phi_{4-A}$ gate electrodes during image integration be provided in a phase corresponding to simply halting the dynamic forward clocking process. FIG. 4 and FIG. 5 each diagram a forward clocking sequence which meets this desire.

FIG. 4 shows $\phi_{1-A}$, $\phi_{2-A}$, $\phi_{3-A}$ and $\phi_{4-A}$ potentials (upward direction being relatively positive) which are close to being square-wave and resemble those clocking potentials used previously by Sequin and Kosonocky. Halting clocking at time $t_1$, for example, would establish the image-register gate electrode biasing condition shown in FIG. 3 potential energy profile (a). Halting clocking at time $t_2$, for example, would establish the image-register gate electrode biasing condition shown in FIG. 3 potential energy profile (b).

FIG. 5 shows $\phi_{1-A}$, $\phi_{2-A}$, $\phi_{3-A}$ and $\phi_{4-A}$ potentials (upward direction being relatively positive) which are sequentially low, with little overlapping of the low conditions of successive gate electrodes. Halting clocking at time $t_3$, for example, would establish the image-register gate electrode biasing of FIG. 3 profile (a); and halting clocking at time $t_4$, for example, would establish the image register gate electrode biasing of FIG. 3 profile (b). Reducing the overlap of the low conditions of successive gate electrodes during dynamic clocking is optional with four phases, since the minimum length of the potential energy wells is two gate electrode lengths in either the FIG. 4 or FIG. 5 case. That is, the maximum amount of charge contained in a charge packet before spillage out of the well into an anti-blooming drain or into another well is the same in either case. The charge handling capability of the image register is unaffected by the choice of the FIG. 4 or the FIG. 5 image-register clocking scheme.

However, when clocking the image register with a larger even number of phases—e.g. six—reducing the overlap of the low conditions of successive gate electrodes increases the minimum length of the potential energy wells and therefore increases the charge handling capability of the image register. Clocking the image register with an even number of phases larger than four becomes desirable as the dimensions of the pixels in the direction of charge transfer becomes larger, in order to keep gate electrode lengths short enough to avoid generation of grain. (Since the maximum usable transfer speed in charge coupled devices decreases as the square of gate electrode length, the shorter length gate electrodes permit pixel size to be increased while keeping charge transfer speeds reasonably high.) This has been pointed out by H. Elabd, W.F. Kosonocky, and D.F. Battson in their U.S. patent application Ser. No. 685,725 filed Dec. 24, 1984, entitled "CCD IMAGERS WITH PIXELS AT LEAST THIRTY MICRONS LONG IN THE DIRECTION OF CHARGE TRANSFER", and assigned to RCA Corporation.

Figure 6:
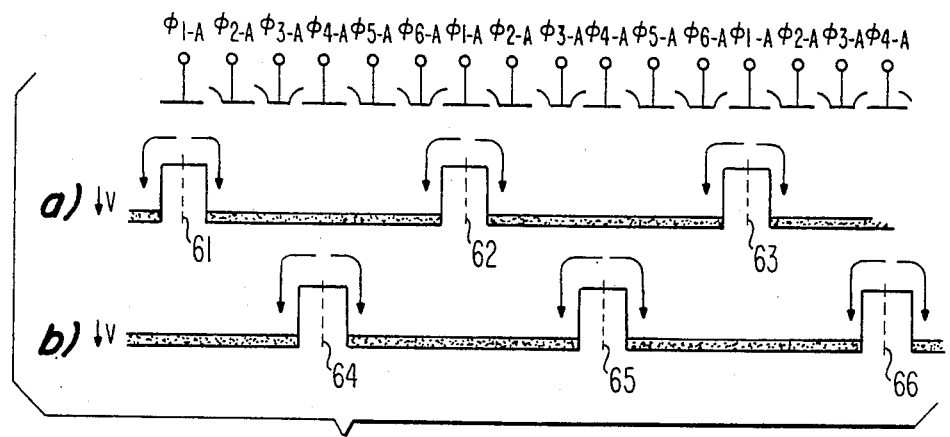
FIG. 6 is a diagram of potential energy levels in the six-phase-clocked image register of a CCD imager operated in accordance with the invention.

FIG. 6 shows a potential energy profile (a) as would, during integration of odd-field image-element samples, be found in the six-phase image register of another CCD imager embodying the invention. FIG. 6 also shows a potential energy profile (b) as would, during integration of even-field-image-element samples, be found in that six-phase image register. Image elements six gate electrode lengths long are integrated, with potential energy barriers being only one gate electrode length long and potential energy wells being five gate electrode lengths long. Such image elements are defined between successive pairs 61, 62; 62, 63; etc. of continental divides centered under the $\phi_{1-A}$ gate electrodes, when odd-field samples are being integrated in potential energy wells under respective groups of contiguous $\phi_{2-A}$, $\phi_{3-A}$, $\phi_{4-A}$, $\phi_{5-A}$, $\phi_{6-A}$ gate electrode groups. And such image elements are defined between successive pairs 64, 65; 65, 66; etc. of continental divides centered under the $\phi_{4-A}$ gate electrodes, when even-field samples are being integrated in potential energy wells under respective groups of contiguous $\phi_{5-A}$, $\phi_{6-A}$, $\phi_{1-A}$, $\phi_{2-A}$, $\phi_{3-A}$ gate electrodes.

Figure 7:
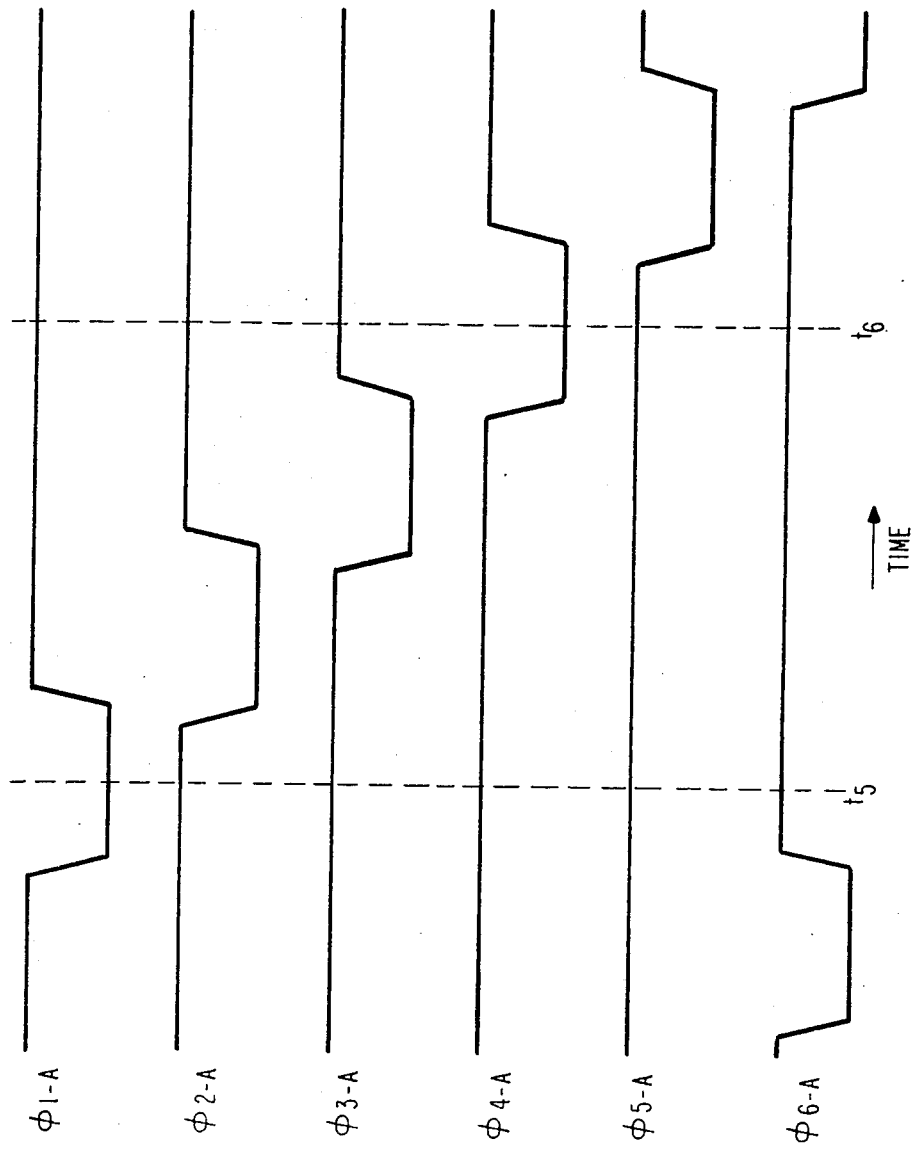
FIG. 7 is a timing diagram of the six-phase image-register clocking voltages used in certain of the FIG. 6 CCD imagers.

FIG. 7 shows the clocking sequence for the $\phi_{1-A}$, $\phi_{2-A}$, $\phi_{3-A}$, $\phi_{4-A}$, $\phi_{5-A}$, $\phi_{6-A}$ potentials applied to the gate electrodes of the six-phase image register, partially shown in FIG. 6. Halting clocking at time t5, for example, would establish the image-register gate electrode biasing condition shown in FIG. 6 potential energy profile (a). Halting clocking at time t6, for example, would establish the image-register gate electrode biasing condition shown in FIG. 6 potential energy profile (b). Note that since no more than two of the image gate electrodes are at negative voltages at the same time, charge can be contained under four successive gate electrodes at all times. This maximizes the charge handling capability of the six-phase image register for given amplitude clocking voltages. The general scheme of the invention with regard to interlaced image integration in an image register clocked in an even number (at least four) of phases should be perceptible now to the reader skilled in the art, and how to make an image register clocked in eight or ten or more phases in accordance with the invention should be evident to him in light of the foregoing disclosure.

Figure 8:
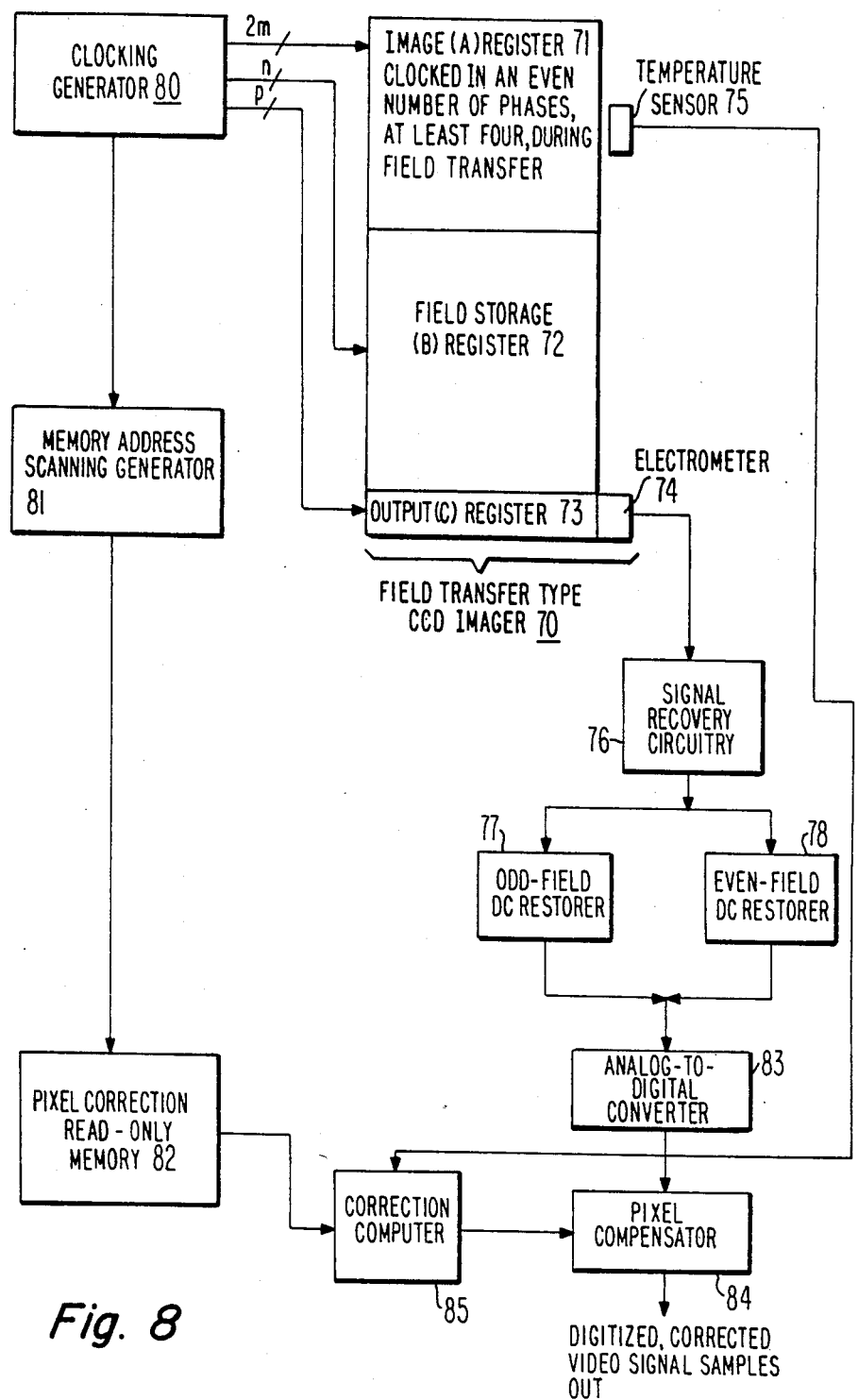
FIG. 8 is a block diagram of a CCD imager embodying the invention.

FIG. 8 shows the general electrical architecture of a video camera which embodies the invention. The FIG. 8 camera includes an n-channel CCD imager 70 of field transfer type having an image (or A) register 71 and a field storage (or B) register 72. Image register 71 comprises a plurality of parallelled charge transfer channels (not specifically shown, but which would extend from top to bottom of the register as illustrated in FIG. 8), and field storage register 72 comprises a like-numbered plurality of parallelled charge transfer channels with respective input ends connected to the output ends of corresponding charge transfer channels in image register 71. The charge transfer channels in field storage register 72 and a succeeding output line (or C) register 73 are shielded from irradiation that would generate charge carriers through photoconversion. Registers 71, 72, 73 receive their clocking signals from a clocking generator 80 which conventionally is external to the CCD imager 70. Image register 71 receives an even number 2m of clock phases from clocking generator 80. The number m is a positive integer at least two. Field storage register 72 receives a number n of clock phases from clocking generator 80; n may be the same as 2m or different. Output line register 73 receives a number p of clock phases from clocking generator 80; p may be the same as n or different.

The charge transfer channels in image register 71 are irradiated over substantial portions of their lengths by imaged light, and elements of the light image, pixels, are photoconverted to charge packets in the respective charge transfer stages successively arranged in those charge transfer channels. This irradiation takes place over image integration intervals which conventionally extend over the field trace interval of the video signals generated from the output signal samples supplied by CCD imager 70. During image integration intervals dynamic clocking of the image register 71 is halted, and static clocking signal voltages are maintained on the gate electrodes crossing over the charge transfer channels of image register 71. These static clocking signal voltages maintain potential barriers at selected (spatial) intervals in the charge transfer channels to define the boundaries of pixels in accordance with the invention. The in-channel potential barriers are induced under selected gate electrodes receiving less positive phases of clocking voltage than the remaining gate electrodes under which the photocharge generated in response to light image elements is accumulated.

Field transfer intervals are interspersed among successive image integration intervals and are arranged to occur within the field retrace intervals of the video signals generated from the output signal samples supplied by CCD imager 70. During each of these field transfer intervals, relatively high rate forward-clocking signals are applied to both the image register 71 and field storage register 72. This transfers the charge packets representative of image element intensity, which charge packets have accumulated at positions in the charge transfer channels of image register 71 during the preceding image integration interval, into corresponding positions in the charge transfer channels of field storage register 72. That is, the image register 71 and field storage register 72 receive dynamic clocking signals cyclic at the same relatively high forward-clocking rate.

During the field trace time following a field transfer interval, dynamic clocking of the image register 71 is discontinued and static clocking conditions are reimposed on image register 71. Dynamic clocking of field storage register 72 continues at a relatively slow rate, charge packets being advanced a line at a time through field storage register 72 each line retrace interval, per conventional operation. The line of charge packets transferred out of the output end of field storage register 72 is entered parallelly-in-time into respective ones of the successive charge transfer stages in the charge transfer channel of output line register 73, receptive of static clocking signal during the line retrace interval. During each subsequent line trace interval line register 73 is dynamically clocked at the pixel scan rate to operate as a shift register to transfer charge packets serially in time to an electrometer 74, or other charge sensing stage configuration. The charge sensing stage responds to the charge packets transferred to it to provide corresponding output signal samples of video signal to the input circuit of a signal recovery circuitry 76.

Signal recovery circuitry 76 normally includes a dc-blocking capacitor in its input circuit, so dc-restoration must be done further on in the camera chain. Some high-frequency roll-off to suppress transient peaks is normally employed in the 76 input circuit, and the video samples from electrometer 74 are then passed through a low-noise voltage amplifier. Signal recovery circuitry 76 may include a sample-and-hold circuit after the low-noise voltage amplifier, sampling at output register 73 clock rate, to convert the amplified video voltage samples to continuous analog signal, as is commonly done in prior-art pre-amplifiers. Further, the sample-and-hold circuit may be preceded by a high-pass filter to suppress reset noise arising in electrometer 74, in such case, the suppressed low-frequency video components are replaced by the spectrum around the first harmonic of output register 73 clock frequency heterodyning to baseband. This later type of operation is described by P.A. Levine in his presently allowed U.S. patent application Ser. No. 590,044 filed Mar. 15, 1984, entitled "CCD FLOATING-ELEMENT OUTPUT STAGES PROVIDING LOW RESET NOISE WITH SINGLE SAMPLING", assigned to RCA Corporation, and incorporated herein by reference. Signal recovery circuitry 76 may use correlated double sampling instead after the low-noise voltage amplifier.

An analog-to-digital converter 83 is to be used after signal recovery circuitry 76, however, to implement a pixel-by-pixel correction of video signal, as will be described further on in this specification. The analog-to-digital converter can be operated to sample at output register 73 clock rate. This can make the use of a sample-and-hold circuit in signal recovery circuitry 76 a redundant function, providing that the function of intervening dc restorers 77 and 78 can be carried out on sampled rather than continuous video signal inputs.

In cameras which are preferred embodiments of the invention, provision is made to suppress frame-rate flicker. This flicker is a field-to-field modulation of fixed-pattern noise visible during the sensing of faint optical images, when camera gain is boosted to higher levels. Frame-rate flicker problems arise in a variety of ways, and different solutions are employed for these various problems.

A predominant source of frame-rate flicker, whenever line interlace of any type is used, concerns the dc restoration process used after electrometer 74. Stopping the forward clocking of image register 71 at the end of a field transfer introduces a change in average electrostatic voltage in its charge transfer channel. Since the combined capacitance to substrate of the gate electrodes in image register is typically a few thousand picofarads and the substrate can have thousands of ohm resistance to ground, the settling time of the register can extend over several lines of the active picture interval. These transients associated with settling of the image register couple to the electrometer 74; and they affect the electrometer response somewhat differently between odd fields and even fields, because the patterns of static gate electrode potentials on the image register 71 gate electrodes differ in position somewhat in odd fields as compared to even fields. This source of frame-rate flicker is taken care of by providing separate dc-restorers 77 and 78 for odd fields and for even fields. This is in accordance with P.A. Levine's teaching in his presently allowed U.S. patent application Ser. No. 685,250 filed Dec. 21, 1984, entitled "SUPPRESSION OF FRAME-RATE FLICKER IN CCD IMAGERS USING FIELD INTERLACE", assigned to RCA Corporation, and included herein by reference. To conserve the dynamic range of analog-to-digital converter 83, and to avoid the introduction of frame-rate flicker owing to quantization noise introduced by analog-to-digital converter 83 differing from field to field, the separate dc restorers 77 for odd fields and 78 for even fields are placed before the input circuit of analog-to-digital converter 83.

With the foregoing type of frame-rate flicker taken care of, the remaining fixed-pattern frame-rate flicker that extends over the entire field is mostly due to differences in the ways charge integration takes place in image register 71 during odd fields and during even fields. This frame-rate flicker (which the prior art Kosonocky imager avoided by making image integration conditions essentially identical in successive fields) divides into two principal classes: frame-rate flicker due to differences in quantum efficiencies in odd fields and in even fields (which affects "whites") and frame rate flicker due to differences in dark current collection in odd fields and in even fields (which affects "blacks").

The difference in the amount of charge collected in one set of alternate fields and the other interleaving set of alternate fields—i.e. the difference in the quantum efficiencies in the odd fields and in the even fields—is due to differences in the two sets of fields with regard to the depths the charge integrating wells of the image register extend below the surface of the semiconductor substrate. This comes about because some portion of the light is photoconverted below the image-register charge integrating wells, and the charge carriers thus generated are likely to recombine before being collected into the charge transfer channels. The effect of this recombination on quantum efficiency varies as charge integrating well depth varies. The depths of the image-register integrating wells are defined by the electrostatic potentials electrostatically induced in the semiconductor substrate responsive to electrometer force potentials applied to the gate electrodes. The relation of the electrostatic potential in the semiconductor substrate to the electromotive force potential applied to the overlying gate electrode depends on the thickness of the insulation between the gate electrode and the charge transfer channel.

As initial steps in making quantum efficiencies as alike as possible between two successive fields in the FIG. 8 imager, it is desirable to induce potential barriers under a set of gate electrodes in the odd fields which is disposed in the same layer of polysilicon as the set of gate electrodes under which potential barriers are induced in the even fields. These two sets of gate electrodes are spatially interleaved with their centers at regular spatial intervals. The gate electrodes in these two sets are uniform in length. FIG. 3 and FIG. 6 each shows these steps having been taken. The potentials applied to each of these sets of gate electrodes alternate (in opposite phasing) between the same two values of gate electrode force potential, the switch being made between successive fields.

In the FIG. 3 four-phase image register, potential barriers are induced under $\phi_{1\text{-}A}$ gate electrodes in one set of alternate fields and under $\phi_{3\text{-}A}$ gate electrodes in the other set of alternate fields. Both the set of $\phi_{1\text{-}A}$ gate electrodes and the set of $\phi_{3\text{-}A}$ gate electrodes are located in the same polysilicon layer, the first. During both sets of alternate fields, then, charge collection is in storage wells each of which is defined by a gate electrode in the first polysilicon layer flanked by two gate electrodes in the second polysilicon layer. If the gate electrodes under which storage wells are induced receive the same electromotive force potentials on alternate fields, the average depths of the image register charge transfer channels should remain substantially unchanged from field to field, causing quantum efficiency to be substantially the same in all fields. (There may be some localized differences in quantum efficiencies where gate electrodes are improperly formed.)

In the FIG. 6 six-phase image register, potential barriers are induced under $\phi_{1\text{-}A}$ gate electrodes in one set of alternate fields and under $\phi_{4\text{-}A}$ gate electrodes in the other set of alternate fields. Both the set of $\phi_{1\text{-}A}$ gate electrodes and the set of $\phi_{4\text{-}A}$ gate electrodes are located in the same polysilicon layer, the first. During both sets of alternate fields, then, charge collection is in storage wells each of which is defined by a succession of a second-polysilicon-layer gate electrode, a third-polysilicon-layer gate electrode, a first-polysilicon-layer gate electrode, a second-polysilicon-layer gate electrode and a third-polysilicon-layer gate electrode. Again, if the gate electrodes under which storage wells are induced receive the same electromotive force potentials on alternate fields, the average depths of the image register charge transfer channels should remain substantially unchanged from field to field, causing quantum efficiency to be substantially the same in all fields.

In either the FIG. 3 or FIG. 4 image register, any remaining differences in the overall quantum efficiencies in the two sets of alternate fields can be compensated for. This is done by appropriately adjusting the electromotive force potentials applied to the storage-well-inducing gate electrodes in the two sets of alternate fields. The technique for obtaining equal quantum efficiencies for odd fields and for even fields, in image registers clocked in 2m phases where m is at least two than 3 should now be apparent to the reader.

The amount of dark current collected over a field time in a storage well induced in the image register like the quantum efficiency depends on the length, width and depth of the well. Dark current collection, unlike quantum efficiency, is also a function of the temperature of the portion of the semiconductor substrate in which that well is electrostatically induced; but the thermal integration in the semiconductor substrate is sufficiently large to keep this temperature dependence of dark current from significantly affecting frame-rate flicker. If the storage wells are made to have substantially equal depths from field to field to make quantum efficiency constant, this also substantially eliminates one possible source of dark current modulation from field to field. Remnant dark current modulation from field to field will be suppressed in part by the use of separate dc restorers for odd and even fields.

Frame-rate flicker may occur in localized portions of the image field commonly referred to as "defect locations". There are possibilities of gate electrode imperfections causing storage well length dimensions to err locally, channel stop imperfections causing storage well width dimensions to err locally, substantially doping imperfections causing storage well depth to err locally. Substrate doping imperfections can cause charge carrier recombination rate to be higher in localized areas or can cause high localized dark current. This localized frame-rate flicker can be compensated for using pixel corrections taken from read-only memory. These pixel corrections will also complete the suppression of fixed-pattern dark current modulation at frame rate as may otherwise appear over large regions of the image field.

In FIG. 8 the clocking generator 80 supplies synchronizing signals to a memory address scanning generator 81. Memory address scanning generator 81 scans the successive addresses of a pixel correction read-only memory 82 (usually of programmable type) in synchronism with the generation of video signal samples by CCD imager 70. Each video signal sample from CCD imager 70 is digitized by an analog-to-digital converter 83, and the resultant digitized video signal sample is supplied to a pixel compensator 84 to have a correction made to it. This correction is an additive or subtractive offset in nature and is supplied by a correction computer 85. Correction computer 85 responds to a dark current offset value stored for that particular video signal sample in the frame, which value is normalized with regard to temperature, and a temperature measurement made by a temperature sensor 75 in CCD imager 70. From these input data, correction computer 85 calculates the dark current correction for the present operating temperature of imager 70 and supplies it to pixel compensator 84 to add to or subtract from the digitized video signal sample supplied from imager 70 via analog-to-digital converter 83.

The foregoing type of pixel compensation is described per se by P.A. Levine in his U.S. patent application Ser. No. 779,861 filed Sept. 25, 1985 entitled "TEMPERATURE TRACKING DEFECT CORRECTOR FOR A SOLID-STATE IMAGER" and assigned to RCA Corporation. This type of pixel compensation automatically compensates against the second source of field rate flicker. Should the first source of field rate flicker not in fact be negligible, it can also be compensated for, using a more complicated correction computer 85.

The FIG. 8 camera architecture facilitates the further digital processing of video samples later on in the camera chain. Where further video signal processing is to be carried out on an analog basis, it may be desirable to dispense with analog-to-digital converter 83 (modifying pre-amplifier 76 to suit), to introduce a digital-to-analog converter after correction computer 85, and to replace the digital adder in pixel compensator 84 with an analog signal combining circuit.

Figure 9:
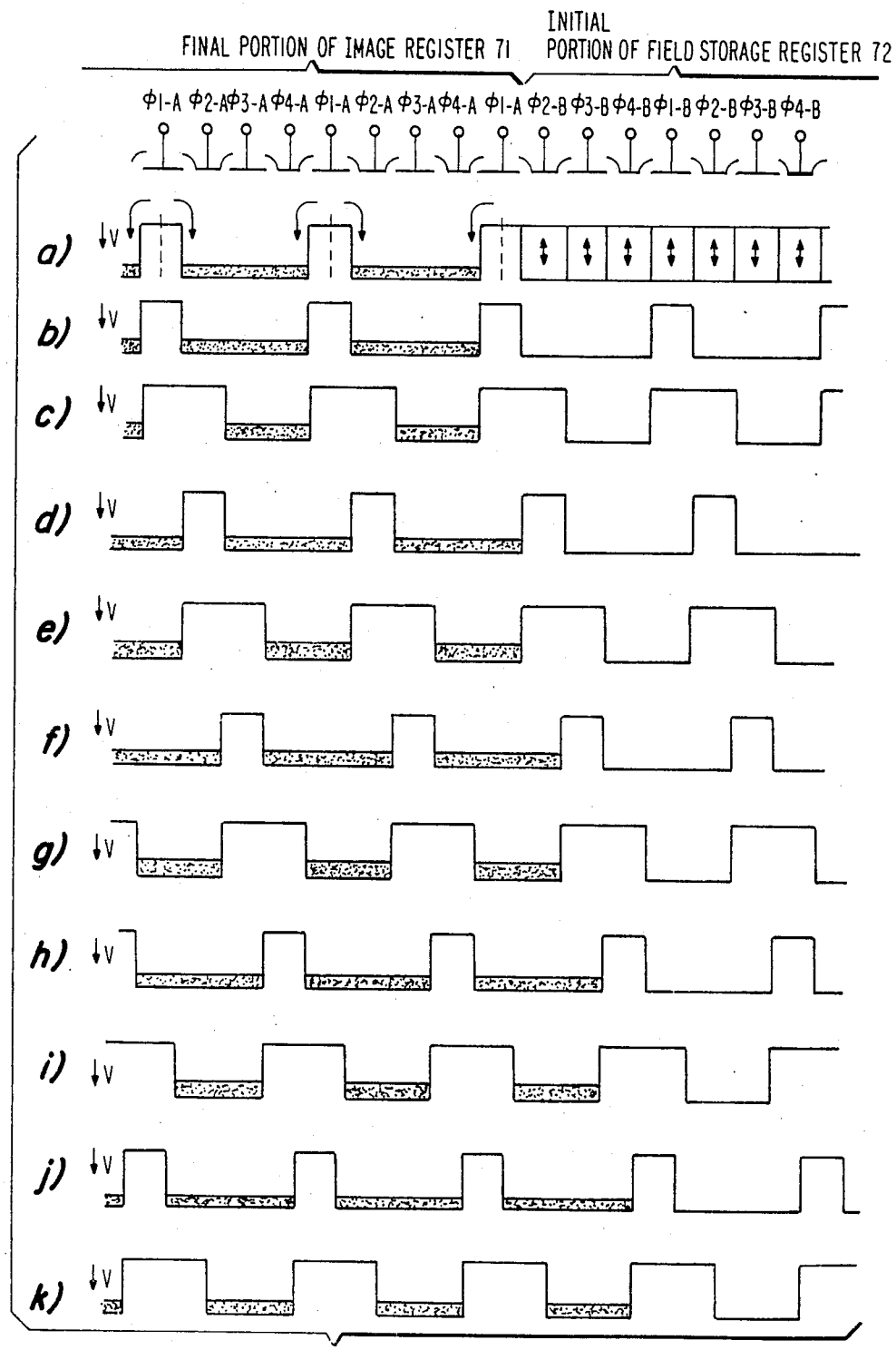
FIGS. 9 and 10 are clocking diagrams of the onset of field transfer in alternate fields, respectively, in a CCD imager having four-phase-clocked image and field storage registers and operated in accordance with the invention.
Figure 10:
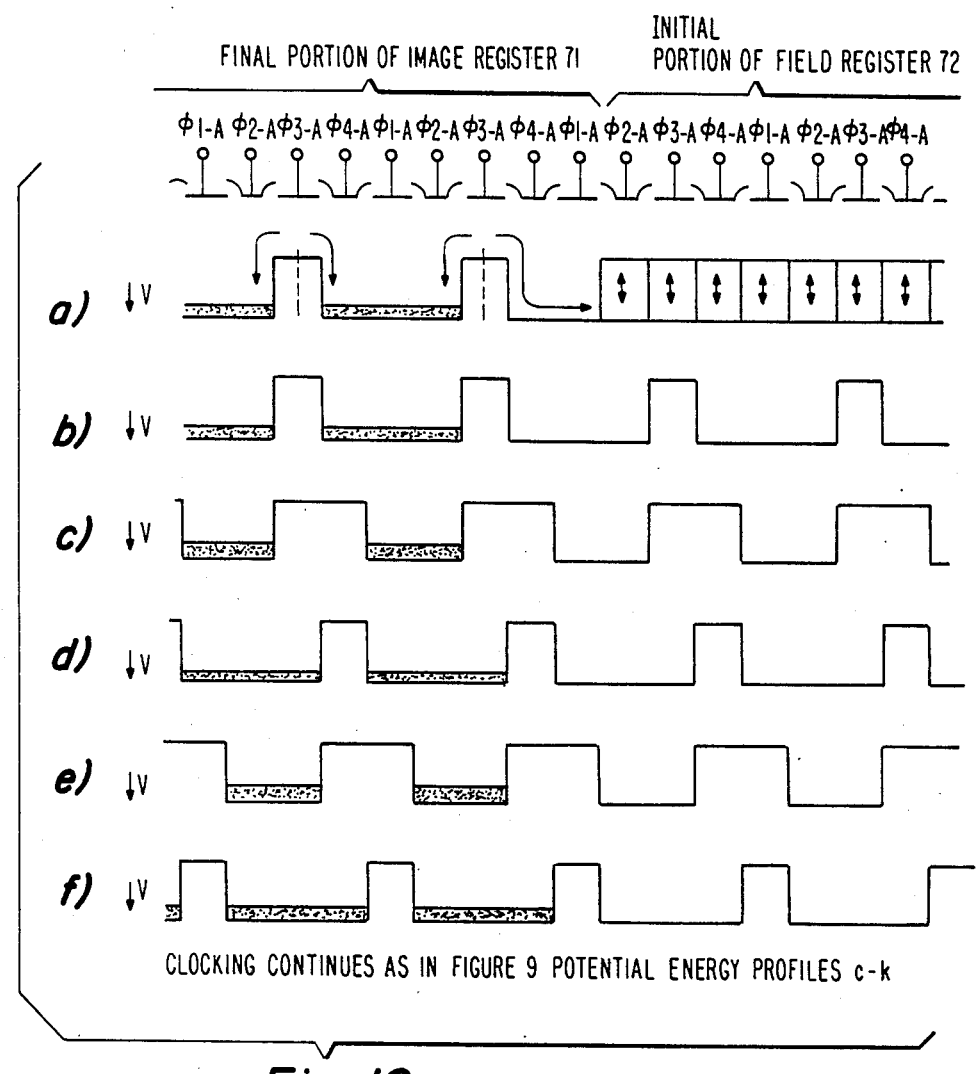

In certain CCD cameras operated in accordance with the invention, the field storage register 72 will be clocked in a number n of phases equal to the even number 2m of phases the imager register 71 is clocked in. FIGS. 9 and 10 diagram the onset of the field transfer interval in the CCD imager of such a camera using four clock phases in both image register 71 and field storage register 72. FIGS. 9 and 10 are each headed by a representation of the succession of gate electrodes at the interface of the image register 71 and field storage register 72. The gate electrodes receptive of the successive-in-time clocking voltage phases $\phi_{1-A}$, $\phi_{2-A}$, $\phi_{3-A}$ and $\phi_{4-A}$ are in image register 71; and the gate electrodes receptive of the successive-in-time clocking voltage phases $\phi_{1-B}$, $\phi_{2-B}$, $\phi_{3-B}$ and $\phi_{4-B}$ are in field storage register 72. The in-channel potential energy profiles, identified by lower case letters, are referred in space to these gate electrodes that are receptive of the electromotive force voltages which determine the in-channel electrostatic voltages in which those potential energies are expressed. In accordance with convention, electrostatic potential is diagrammed positive downward, and charge is considered in quantity of electrons.

FIG. 9 diagrams the onset of transferring to field storage register 72 the charge packets which are subsequently to be read out of register 72 during the next, odd field. As shown in FIG. 9 potential energy profile (a), during the preceding read-out of storage register 72 in an even field, potential energy barriers have been induced under the $\phi_{1-A}$ gate electrodes of the image register 71. Photogenerated charge has been collected in potential energy wells induced under each succession of $\phi_{2-A}$, $\phi_{3-A}$ and $\phi_{4-A}$ gate electrodes in image register 71. The dynamic clocking of field storage register 71 during image integration causes fluctuation of the potential energy profile under each of the $\phi_{2-B}$, $\phi_{3-B}$, $\phi_{4-B}$ and $\phi_{1-B}$ gate electrodes over a range, as indicated in the right hand portion of potential energy profile (a) in FIG. 9. Potential energy profile (b) in FIG. 9 indicates the clocking voltage conditions in the image and field storage registers when field transfer commences with those registers being forward clocked at high rate in synchronism with each other. FIG. 9 potential energy profiles (c) through (k) chart the continuing forward clocking during field transfer up until the time the first line of charge packets has been transferred out of image register 71 into field storage register 72. Forward clocking at high rate then continues at least until all the odd-numbered lines of charge packets are transferred out of the image register into the field storage register. The synchronous forward clocking of the registers may continue for an additional time—e.g. to collect lines of transfer smear samples, or to move charge packets further into the field storage register away from light leakage, or both.

FIG. 10 diagrams the onset of transferring to field storage register 72 the charge packets which are subsequently to be read out of register 72 during the next, even field. As shown in FIG. 10 potential energy profile (a), during the preceding read-out of field storage register 72 in an odd field, potential energy barriers have been induced under the $\phi_{3-A}$ gate electrodes of image register 71. Photogenerated charge has been collected in potential energy wells induced under each succession of $\phi_{4-A}$, $\phi_{1-A}$ and $\phi_{2-A}$ gate electrodes in image register 71. (Charge otherwise tending to collect under the final $\phi_{4-A}$ and $\phi_{1-A}$ gate electrodes of the image register 71 are instead scooped from image register 71 into field storage register 72.) Potential energy profile (b) in FIG. 10 indicates the clocking voltage conditions in the image and field storage registers when field transfer commences with those registers being forward clocked at high rate in synchronism with each other. FIG. 10 potential energy profiles (c) through (f) chart continuing forward clocking up until a time when the transfer of charge packets out of image register 71 into field storage register 72 continues in the same way as in potential energy profiles (e) through (k) of FIG. 9. Forward clocking continues until after all the even-numbered lines of charge packets have been transferred from image register 71 into field storage register 72. The overlapping of successive clock voltage phases can be short, particularly if the positive-to-negative transitions in each clock voltage phase have full times that are a substantial length of the negative clock voltage excursion. In such case the FIG. 9(c), (e), (g), (i) and (k) and the FIG. 10(c) and (e) potential profiles depict short-lived conditions.

In certain cameras embodying the invention clocking generator 80 supplies dynamic clocking signals to image register 71 in an even number 2m of successive phases during field transfer intervals which exceeds the number n of successive phases of clocking signal clocking generator 80 supplies to field storage 72. The timing of these 2m-phase and n-phase clock signals that will allow the transfer of charge packets without disturbing their information content as to pixel intensity will now be explained with regard to a number of specific cases, considering first a case where 2m=4 and n=3.

FIG. 11 timing diagram shows one cycle of a four-phase clocking signal that may be used in the image register 71 of CCD imager 70 and also shows an equal-duration cycle of a three-phase clocking signal that may be applied to the field storage register 72. Equality of duration of the cycles of image register 71 clocking signal and of field storage register 73 clocking signal is a first requirement which must be placed on the forward clocking of charge packets through the two registers. The requirement arises because on every clock cycle time a charge packet must be transferred from the image register to the field storage register in order to avoid any pile-up of successive charge packets in the imager register.

A second requirement on forward clocking through the four-phase image register and three-phase field storage register is that when the final gate electrode of image register 71 goes relatively low in voltage to erect a potential energy barrier in the portion of the charge transfer channel therebeneath, the initial gate electrode of the field storage register 72 is relatively high in voltage so as to have induced a potential energy well thereunder to receive charge displaced from the image register 72.

A third requirement on forward clocking through registers 71 and 72 is that when the final electrode of the image register 71 goes relatively high in voltage, the initial gate electrode of the field storage register 72 must have previously gone relatively low in voltage to prevent charge flowing back from the field storage register 72 into the image register 71. This third requirement restricts the range of possible phasings between the four-phase image register 71 clocking cycle and the three-phase field storage register 72 clocking cycle more than the second requirement does.

While the phasing of these clocking cycles may be displaced to any degree within the second range, it is convenient in terms of simplifying the design of the clocking generator to make every fourth one of the eight transitions per cycle of the four-phase clocking signal to occur simultaneously with every third one of the six transitions per cycle of the three-phase clocking signal. Then all transitions in both clocking signals can be timed with reference to transitions in a master clock oscillator operated at a frequency twelve times the reciprocal of cycle time, or a harmonic of that frequency, through the use of frequency division. Frequency division is easily carried forward by digital counting of master clock oscillator average-axis-crossings, for example.

Figure 12:
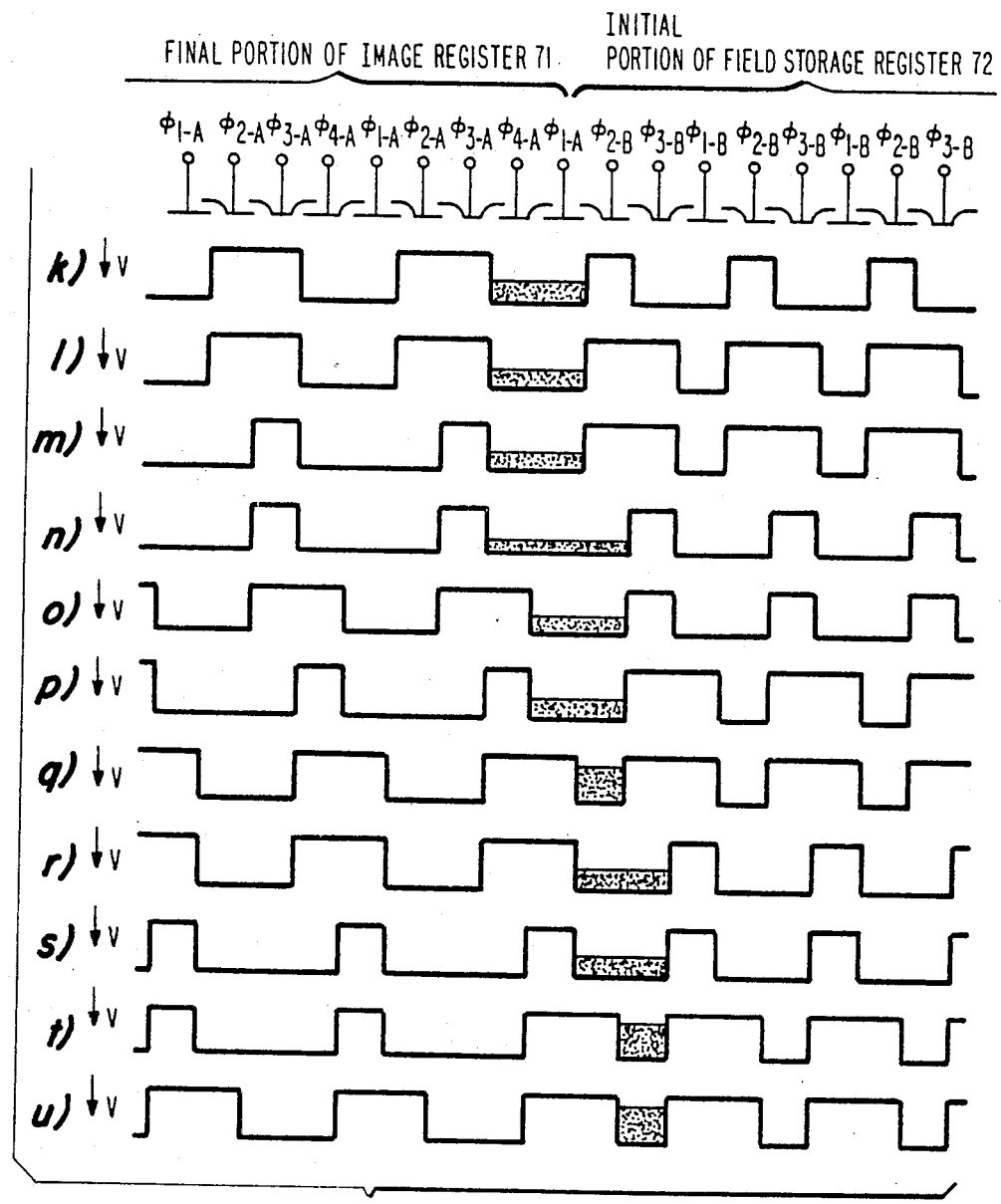

At the bottom of FIG. 11 is a folded time scale showing several successive cycles of clocking with consecutive times (a) through (u) indicated thereon. The in-channel potential energy profiles shown in subfigures of FIG. 12 with corresponding alphanumeric identifications (a) through (u) occur at these times.

The FIG. 12A and 12B in-channel profiles are for one of the charge transfer channels of FIG. 8 image register 71, and for the following one of the charge transfer channels of FIG. 8 field storage register 72. The following assumptions are made, so that the line interlace between alternate fields can be considered referring to FIGS. 12A and 12B. During one set of alternate fields the potential energy barriers defining pixel boundaries will be erected under the $\phi_{3-A}$ gate electrodes by making the $\phi_{3-A}$ gate electrodes relatively negative (low) respective to the relatively positive high $\phi_{1-A}$, $\phi_{2-A}$, and $\phi_{4-A}$ gate electrodes of the image register 71. This is the image register static clocking condition shown in FIG. 12A, potential energy profile (a). The dynamic clocking of the field storage register 72 causes clocking voltages to range from high to low conditions. The charge packet descriptive of the first full pixel is shown in stipple to facilitate the reader keeping track of the transfer of charge from the image register 71 to the field storage register 72 as dynamic clocking of the image register 71 is resumed during field transfer. The sequential steps in the initial portion of this field transfer process are diagrammed by the in-channel potential energy profiles (b) through (u) of FIGS. 12A and 12B.

In the other set of alternate fields, in order to secure line interlace, the potential barriers defining pixel boundaries will be erected under the $\phi_{1-A}$ gate electrodes in image register 71, by biasing them low compared to the $\phi_{2-A}$, $\phi_{3-A}$ and $\phi_{4-A}$ gate electrodes. So, when dynamic clocking in image register 71 is resumed, the initial step in the field transfer clocking sequence will be as shown in FIG. 12A potential energy profile (g), with the forward clocking sequence continuing on from that step then per profiles (h) through (u) in FIGS. 12A and 12B.

FIGS. 13, 14A and 14B illustrate the operation of a six-phase forward-clocked image register 71 followed in cascade connection by a three-phase forward-clocked field storage register 72, which illustration corresponds to that provided by FIGS. 11, 12A and 12B for a four-phase forward-clocked image register 71 followed in cascade by a three-phase forward clocked field storage register 72. FIG. 14A, potential energy profile (a) shows in-channel potential barriers being induced under the $\phi_{4-A}$ gate electrodes during image integration times in a one set of alternate fields, responsive to $\phi_{4-A}$ gate electrodes being relatively low in voltage compared to $\phi_{1-A}$, $\phi_{2-A}$, $\phi_{3-A}$, $\phi_{5-A}$ and $\phi_{6-A}$ gate electrodes. FIGS. 14A and 14B potential energy profiles (b) through (w) show the initial portion of field transfer time when six-phase dynamic clocking is restored in the image register 71. In the other set of alternate fields, the resumption of dynamic clocking of the image register 71 will proceed from the in-channel potential energy profile shown in FIG. 14A potential energy profile (h), continuing through the remaining potential energy profiles (i) through (w), etc., of FIGS. 14A and 14B.

Forward-clocking a six-phase-clocked image register 71 together with a three-phase-clocked field storage register 72 is attractive in that all clocking signal transitions in the field storage register can occur simultaneously with clocking signal transitions in the image register 71. This reduces any problems with clock coupling between image and field storage registers through the substrate, and it simplifies the generation of the lower rate clocking signals by pulse-rate division. If one uses non-uniform duration three-phase clocking signals to forward clock a field storage register 72 receptive of charge packets transferred from a four-phase-clocked image register 71, these advantages can also be obtained.

FIG. 15 is a timing diagram showing such a modified cycle of three-phase clocking for field storage register 72. FIG. 16 shows illustrative in-channel potential energy profiles when a modified cycle of three-phase field-storage-register clocking register is used together with the same four-phase image register clocking previously appearing in FIG. 11.

FIG. 17 is a timing diagram showing another cycle of three-phase clocking for field storage register 72, which cycle uses non-uniform duration three-phase clocking signals. This clocking cycle for field storage register 72 accommodates the use of substantially square-wave clocking signal voltages in image register 71, of the sort shown in FIG. 4. FIGS. 18A and 18B illustrate the in-channel potential energy profiles at the junction of image register 71 and field storage register 72 charge transfer channels at the onset of the field transfer interval in which charge packets sampling an even-numbered field are transferred. When charge packets sampling an odd-numbered field are transferred potential energy profiles similar to (f) et seq. of FIGS. 18A and 18B will obtain.

The clocking scheme diagrammed in FIGS. 17, 18A and 18B is interesting from the standpoint of the simplicity by which field storage register 72 clocking can be derived during field transfer intervals. During field transfer $\phi_{3-B}$ is synchronous with $\phi_{4-A}$. In negative logic, $\phi_{1-B}$ is generated by ANDing $\phi_{1-A}$ and $\phi_{2-A}$; and $\phi_{2-B}$ is generated by ANDing $\phi_{2-A}$ and $\phi_{3-A}$. That is, the logic convention is chosen to make a barrier-inducing gate electrode voltage a logic ONE and a well-inducing gate electrode voltage a logic ZERO. The AND results are then stretched somewhat to provide correct pulse overlap.

Note that in potential energy profile (e) of FIG. 18B the charge packet just transferred into the field storge register in squeezed into a potential energy well only one gate electrode length long. Any overflow of this well may be carried away by an anti-blooming drain, or the possibility of overflow can be avoided in a number of ways. For example, well depth in the image register is often made shallower (by adjustment of image register gate electrode voltages) during image integration than during field transfer, and the well depth in the field storage register is relatively deep. This forestalls the overflow problem at the beginning of the field storage register.

Modifications of the clocking schemes described in connection with FIGS. 11–16 can be made in which the overlap of successive clock voltage phases is shortened and clock voltage fall times are lengthened.

In discussing the transfer of charge packets from image register 71 to field storage register 72 of the FIG. 8 imager (as was done in connection with FIGS. 9, 10 12A&B, 14A&B, 16, and 18A&B) it was assumed that the light shield over field storage register did not extend over the final charge transfer stages of the image register 71 charge transfer channels. This was done so to facilitate the description of the movement of charge packets from image register 71 to field storage register 72, so there was no need to consider the transfer of charge packets from storage wells in image register 71 which are located under a light shield and are therefore theoretically empty. In actual practice, the light shield extends over electrometer 74, over output line register 73, over field storage register 72 and over the lower portion of image register 71 as shown in FIG. 8. Image register 71 is made so the last ten charge transfer stages or so in each of its charge transfer channels are shielded from light, so that light coming in at an angle under the light shield will not reach the field storage register 72. During field transfer the charge packets collected in these "extra" stages of image register 71 transfer through the field storage register 72 to output line register 73, to be clocked to a drain during a line trace interval just prior to actual picture scan.

What is claimed is:

1. A solid-state video camera providing line interlace between odd-numbered scan lines in odd-numbered ones of successively oridinally numbered field scan intervals and even-numbered scan lines in even-numbered ones of said field scan intervals, said solid-state video camera comprising:
   a CCD imager of field transfer type including an image register, a field storage register into which charge packets are transferred from said image register during field transfer intervals between successive field scan intervals, and means for converting successive lines of the charge packets intervals read from said field storage register during each field scan interval into raster-scanned video signal samples, each of which video signal samples is responsive to a respective one of said charge packets transferred from said field storage register;

a parallel array of charge transfer channels included within said image register, disposed in a substrate of semiconductive material, illuminated by an optical image for generating charge carriers therein by photoconversion during saaid field scan intervals, and crossed by gate electrodes succesive ones of which are successively ordinally numbered first through $2m^{th}$ in repeating cycles of 2m gate electrodes, which cycles repeat in arbitrary spatial phasing, m being a positive integer at least two;

means for applying during field transfer intervals forward clocking signal voltages in first through $2m^{th}$ successive phases to correspondingly numbered ones of the gate electrodes of each cycle crossing the charge transfer channels of said image register;

means for applying during even-numbered field scan intervals a well-inducing voltage to all except the first gate electrode of each cycle crossing the charge transfer channels of said image register, for inducing potential energy wells in the portions of those charge transfer channels underlying each continuous succession of those gate electrodes of each cycle to which said well-inducing voltage is then applied, in which potential energy walls charge carriers generated through photoconversion are collected into charge packets representative of said odd-numbered scan lines;

means for applying during even-numbered field scan intervals a barrier-inducing voltage to the first gate electrodes of each cycle crossing the charge transfer channels of said image register, for inducing potential energy barriers to charge transfer between adjacent ones of the potential energy walls then induced in said charge transfer channels;

means for applying during odd-numbered field scan intervals said well-inducing voltage to all except the $(m+1)^{th}$ gate electrode of each cycle crossing the charge transfer channels of said image register, for inducing potential energy wells in the portions of those charge transfer channels underlying each continuous succession of those gate electrodes to which said well-inducing voltage is then applied, in which potential energy wells charge carriers generated through photoconversion are collected into charge packets representative of said even-numbered scan lines;

means for applying during odd-numbered field scan intervals said barrier-inducing voltage to the $(m+1)^{th}$ gate electrode of each cycle crossing the charge transfer channels of said image register, for inducing potential energy barriers to charge transfer between adjacent ones of the potential energy wells then induced in said charge transfer channels; and means for suppressing frame rate flicker, which means includes:

a read-only memory for storing correction factors for eacch raster-scanned video signal sample from said CCD imager, over a frame comprising an odd-numbered field and an even-numbered field;

a temperature sensor with said CCD imager for supplying an indication of the CCD imager operating temperature;

means for computing an offset for each video signal sample, responsive to its correction factor and said indication of the CCD image operating temperature; and means for compensating eeach video signal sample by its computed offset 2. A solid-state video camera as set forth in claim 1 including:

signal recovery circuitry, to an input circuit of which said raster-scanned video signal samples are applied and from an output circuit of which an amplified raster-scanned video signal is supplied in response to those samples; and means for restoring dc to said amplified raster-scanned video signal during odd-numbered field scans; and separate means for restoring dc to said amplified raster-scanned video signal during even-numbered field scans.

3. A solid-state video camera as set forth in claim 1 wherein said field storage register is forward clocked with clocking voltages during field transfer intervals, which are synchronous with the 2m-phase forward clocking voltages then applied to said image register gate electrodes.

4. A solid-state camera as set forth in claim 1 wherein said field storage register is forward clock in a number n, fewer than 2m, phases during field transfer intervals, saaid phases having the same periodicity as the 2m phases of forward clocking voltages thenn applied to said image register gate electrodes, selected phases of said image register forward clocking voltages and of said field storagee register forward clocking voltages being arranged to overlap in time so as to avoid merger of successive lines of charge packets during their transfer from said image register to said field storage register.

5. A solid-state camera as set forth in claim 4 wherein said field storage register is forward clocked with three-phase clocking voltages during field transfer intervals.

6. A solid-state video camera providing line interlace between odd-numbered scan lines in odd-numbered ones of successively ordinally numbered field scan intervals and even-numbered scan lines in even-numbered ones of said field scan intervals, said solid-state video camera comprising:

a CCD imager of field transfer type including an image register, a field storage register into which charge packets are transferred from said image register during field transfer intervals between successive field scan intervals, and means for converting successive lines of the charge packets intervals read from said field storage rgister during each field scan interval into raster-scanned video signal samples, each of which video signal samples is responsive to a respective one of said charge packets transferred from said field storage register;

a parallel array of charge transfer channels included within said image register, disposed in a substrate of semiconductive material, illuminated by an optical image for generating charge carriers therein by photoconversion during said field scan intervals, and crossed by gate electrodes successive ones of which are successively ordinally numbered first through $2m^{th}$ in repeating cycles of 2m gate electrodes, which cycles repeat in arbitrary spatial phasing, m being a positive integer at least two;

means for applying during field transfer intervals forward clocking signal voltages in first through $2m^{th}$ successive phases to correspondingly numbered ones of the gate electrodes of each cycle crossing the charge transfer channels of said image register;

means for applying during even-numbered field scan intervals a well-inducing voltage to all except the first gate electrode of each cycle crossing the charge yransfer channels of said image register, for inducing potential energy wells in the portion of those charge transfer channels underlying each continuous succession of those gate electrodes of each cycle to which said well-inducing voltage is then applied, in which potential energy wells charge carriers generated through photoconversion are collected into charge packets representative of said odd-numbered scan lines;

means for applying during even-numbered field scan intervals a barrier-inducing voltage to the first gate electrodes of each cycle crossing the charge transfer channels of said image register, for inducing potential energy barriers to charge transfer between adjacent ones of the potential energy wells then induced in said charge transfer channels;

means for applying during odd-numbered field scan intervals said well-inducing voltage to all except the $(m+1)^{th}$ gate electrode of each cycle crossing the charge transfer channels of said image register, for inducing potential energy wells in the portions of those charge transfer channels underlying each continuous succession of those gate electrodes to which said well-inducing voltage is then applied, in which potential energy wells charge carriers generated through photoconversion are collected into charge packets representative of said even-numbered scan lines;

means for applying during odd-numbered field scan intervals said barrier-inducing voltage to the $(m+1)^{th}$ gate electrode of each cycle crossing the charge transfer channels of said image register, for inducing potential energy barriers to charge transfer between adjacent ones of the potential energy wells then induced in said charge transfer channels;

signal recovery circuitry, to an input circuit of which said raster-scanned video signal samples are applied and from an output circuit of which an amplifier raster-scanned video signal is supplied in response to those samples; and means for suppressing frame rate flicker which means includes;

means for restoring dc to said amplified raster-scanned video signal during odd-numbered field scans, separate means for restoring dc to said amplified raster-scanned video signal during even-numbered field scans, a read-only memory for storing correction factors for each raster-scanned picture element location in the image register of said CCD imager, a temperature sensor with said CCD imager for supplying an indication of the CCD imager operating temperature, means for computing an offset for each video signal sample, which offset is computed responsive to said indication of the CCD imager operating temperature and to the correction factor for the picture element location in which said video sample originated, and means for compensating each video signal sample by its computed offset.

7. A solid-state video camera as set forth in claim 6 wherein said field storage register is forward clocked with clocking voltages during field transfer intervals, which are synchronous with the 2m-phase forward clocking voltages then applied to said image register gate electrodes.

8. A solid-state camera as set forth in claim 6 wherein said field storage register is forward clocked in a number n, fewer than 2m, phases during field transfer intervals, said phases having the same periodicity as the 2m phases of forward clocking voltages then applied to said image register gate electrodes, selected phases of said image register forward clocking voltages and of said field storage register forward clocking voltages being arranged to overlap in time so as to avoid merger of successive lines of charge packets during their transfer from said image register to said field storage register.

9. A solid-state camera as set forth in claim 8 wherein said field storage register is forward clocked with three-phase clocking voltages during field transfer intervals.

10. A solid-state video camera providing line interlace between odd-numbered scan lines in odd-numbered ones of successively ordinally numbered field scan intervals and even-numbered scan lines in even-numbered ones of said field scan intervals, said solid-state video camera comprising:

a CCD imager of field transfer type including an image register, a field storage register into which charge packets are transferred from said image register during field transfer intervals between successive field scan intervals, and means for converting successive lines of the charge packets intervals read from said field storage register during each field scan interval into raster-scanned video signal samples, each of which video signal samples is responsive to a respective one of said charge packets transferred from said field storage register;

a parallel array of charge transfer channels included within said image register, disposed in a substrate of semiconductive material, illuminated by an optical image for generating charge carriers therein by photoconversion during said field scan intervals, and crossed by gate electrodes successive ones of which are successively ordinally numbered first through $2m^{th}$ in repeating cycles of 2m gate electrodes, which cycles repeat in arbitrary spatial phasing, m being a positive integer at least two;

means for applying during field transfer intervals forward clocking signal voltages in first through $2m^{th}$ successive phases to correspondingly numbered ones of the gate electrodes of each cycle crossing the charge transfer channels of said image register;

means for applying during even-numbered field scan intervals a well-inducing voltage to all except the first gate electrode of each cycle crossing the charge transfer channels of said image register, for inducing potential energy wells in the portions of those charge transfer channels underlying each continuous succession of those gate electrodes of each cycle to which said well-inducing voltage is then applied, in which potential energy wells charge carriers generated through photoconversion are collected into charge packets representative of said odd-numbered scan lines;

means for applying during even-numbered field scan intervals a barrier-inducing voltage to the first gate electrodes of each cycle crossing the charge transfer channels of said image register, for inducing potential energy barriers to charge transfer between adjacent ones of the potential energy wells then induced in said charge transfer channels;

means for applying during odd-numbered field scan intervals said well-inducing voltage to all except the $(m+1)^{th}$ gate electrode of each cycle crossing the charge transfer channels of said image register, for inducing potential energy wells in the portions of those charge transfer channels underlying each continuous succession of those gate electrodes to which said well-inducing voltage is then applied, in which potential energy wells charge carriers generated through photoconversion are collected into charge packets representative of said even-numbered scan lines;

means for applying during odd-numbered field scan intervals said barrier-inducing voltage to the $(m+1)^{th}$ gate electrode of each cycle crossing the charge transfer channels of said image register, for inducing potential energy barriers to charge transfer between adjacent ones of the potential energy wells then induced in said charge transfer channels;

said field storage register is forward clocked in a number n, fewer than 2m, phases during field transfer intervals, said phases having the same periodicity as the 2m phases of forward clocking voltages then applied to said image register gate electrodes, selected phases of said image register forward clocking voltages and of said field storage register forward clocking voltages being arranged to overlap in time so as to avoid merger of successive lines of charge packets during their transfer from said image register to said field storage register;

wherein m=2; wherein n=3; wherein during field transfer intervals one phase of the field storage register clocking voltages is synchronous with one phase of the image register clocking voltages; and wherein during field transfer intervals each of the other two phases of the field storage register clocking voltages is respectively synchronous with another phase of the image register clocking voltages ANDed with a remaining one of the phases of the image register clocking voltages, the logic convention being chosen to make barrier inducing voltage logic ONE and well-inducing voltage logic ZERO.

11. A solid-state video camera as set forth in claim 7 including:

signal recovery circuitry, to an input circuit of which said raster-scanned video signal samples are applied and from an output circuit of which an amplified raster-scanned video signal is supplied in response to those samples; and means for restoring dc to said amplified raster-scanned video signal during odd-numbered field scans; and separate means for restoring dc to said amplified raster-scanned video signal during even numbered field scans.

* * * * *